United States Patent
Yuan et al.

(10) Patent No.: US 12,306,489 B2
(45) Date of Patent: May 20, 2025

(54) PHOTOELECTRIC DETECTION BACKPLATE, LIQUID CRYSTAL DISPLAY PANEL AND LIQUID CRYSTAL DISPLAY APPARATUS

(71) Applicant: BOE Technology Group Co., Ltd., Beijing (CN)

(72) Inventors: Guangcai Yuan, Beijing (CN); Hehe Hu, Beijing (CN); Changhan Hsieh, Beijing (CN); Shipei Li, Beijing (CN); Jiayu He, Beijing (CN); Xin Gu, Beijing (CN); Ce Ning, Beijing (CN); Zhengliang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/768,052

(22) Filed: Jul. 10, 2024

(65) Prior Publication Data
US 2024/0361628 A1 Oct. 31, 2024

Related U.S. Application Data

(63) Continuation of application No. PCT/CN2022/139757, filed on Dec. 16, 2022.

(51) Int. Cl.
G02F 1/133 (2006.01)
G02F 1/1335 (2006.01)
G06F 1/16 (2006.01)
H10K 30/88 (2023.01)

(52) U.S. Cl.
CPC .... G02F 1/13318 (2013.01); G02F 1/133509 (2013.01); G06F 1/1652 (2013.01); H10K 30/88 (2023.02)

(58) Field of Classification Search
CPC .......... G02F 1/13318; G02F 1/133509; G02F 1/133; G06F 1/1652; H10K 30/88; H10K 39/32

See application file for complete search history.

(56) References Cited

FOREIGN PATENT DOCUMENTS

| CN | 105070738 A | 11/2015 |
|----|-------------|---------|
| CN | 110444553 A | 11/2019 |
| CN | 110890411 A | 3/2020 |
| CN | 111106140 A | 5/2020 |
| CN | 111244287 A | 6/2020 |
| CN | 111564506 A | 8/2020 |
| KR | 2016-0079476 A | 7/2016 |

OTHER PUBLICATIONS

International Search Report and Written Opinion mailed on Aug. 18, 2023, in corresponding PCT/CN2022/139757, 12 pages.
International Search Report and Written Opinion mailed on Aug. 18, 2023, received for PCT Application PCT/CN2022/139757, filed on Dec. 16, 2022, 09 pages including English Translation.

*Primary Examiner* — Donald L Raleigh
(74) *Attorney, Agent, or Firm* — XSENSUS LLP

(57) ABSTRACT

A photodetection backplane, a liquid crystal display panel and a liquid crystal display apparatus are provided. The photodetection backplane includes: a base substrate; a first organic switching unit arranged at a side of the base substrate; and an organic photodetector arranged at a same side of the base substrate as the first organic switching unit. The organic photodetector is electrically connected to the first organic switching unit, and at least one film layer of the organic photodetector and a film layer of the first organic switching unit are arranged in a same layer and made of a same material.

20 Claims, 13 Drawing Sheets

PHOTOELECTRIC DETECTION BACKPLATE, LIQUID CRYSTAL DISPLAY PANEL AND LIQUID CRYSTAL DISPLAY APPARATUS

CROSS-REFERENCE TO RELATED APPLICATION

The present application is a continuation of International Application No. PCT/CN2022/139757, filed on Dec. 16, 2022, the contents of which are incorporated herein by reference in their entireties for all purposes.

TECHNICAL FIELD

The present disclosure relates to the display technical field, and particularly to a photodetection backplane, a liquid crystal display panel and a liquid crystal display device.

BACKGROUND

Flexible devices are favored by consumers due to their good flexibility, thin size, low power consumption, and resistance to rubbing.

SUMMARY

The present disclosure provides a photodetection backplane, a liquid crystal display panel and a liquid crystal display device.

According to an aspect of the present disclosure, there is provided a photodetection backplane, including:
a base substrate;
a first organic switching unit arranged at a side of the base substrate; and
an organic photodetector arranged at a same side of the base substrate as the first organic switching unit, wherein the organic photodetector is electrically connected to the first organic switching unit, and at least one film layer of the organic photodetector and a film layer of the first organic switching unit are arranged in a same layer and made of a same material.

In an example embodiment of the present disclosure, the first organic switching unit includes:
a first conductive layer arranged at a side of the base substrate, wherein the first conductive layer includes a source electrode and a drain electrode;
an organic planarization layer arranged at a side of the first conductive layer away from the base substrate;
an organic active layer arranged at a side of the organic planarization layer away from the base substrate, wherein the organic active layer is connected to the source electrode and the drain electrode;
a gate insulating layer group arranged at a side of the organic active layer away from the base substrate; and
a gate layer arranged at a side of the gate insulating layer group away from the base substrate, wherein the gate layer includes a gate electrode.

In an example embodiment of the present disclosure, the organic photodetector includes:
a first conductive injection layer arranged at the same side of the base substrate as the first organic switching unit;
a first conductive transport layer arranged at a side of the first conductive injection layer away from the base substrate;
a photoelectric conversion layer arranged at a side of the first conductive transport layer away from the base substrate;
a second conductive transport layer arranged at a side of the photoelectric conversion layer away from the base substrate; and
a second conductive injection layer arranged at a side of the second conductive transport layer away from the base substrate.

In an example embodiment of the present disclosure, the first conductive injection layer and the first conductive layer are arranged in a same layer and made of a same material, and the first conductive injection layer is connected to the drain electrode.

In an example embodiment of the present disclosure, the gate electrode is reused as the first conductive injection layer.

In an example embodiment of the present disclosure, the gate electrode and the first conductive injection layer are arranged in a same layer and made of a same material, and the gate electrode and the first conductive injection layer are spaced apart, and the first conductive injection layer is connected to the drain electrode.

In an example embodiment of the present disclosure, the first organic switching unit further includes:
a first electrode layer arranged between the base substrate and the first conductive layer, wherein the first electrode layer is electrically connected to the first conductive layer.

In an example embodiment of the present disclosure, the first conductive injection layer and the first electrode layer are arranged in a same layer and made of a same material, and the first conductive injection layer is connected with the first electrode layer.

In an example embodiment of the present disclosure, the first organic switching unit further includes:
a passivation layer arranged at a side of the gate layer away from the base substrate.

In an example embodiment of the present disclosure, the first organic switching unit further includes:
a second electrode layer arranged at a side of the passivation layer away from the base substrate.

In an example embodiment of the present disclosure, the first conductive injection layer and the second electrode layer are arranged in a same layer and made of a same material, the first conductive injection layer and the second conductive layer are spaced apart, and the first conductive injection layer is arranged at a side of the first electrode layer away from the base substrate.

In an example embodiment of the present disclosure, a part of the second electrode layer is reused as the first conductive injection layer, and the first conductive injection layer is connected to the first electrode layer.

In an example embodiment of the present disclosure, a part of the second electrode layer is reused as the first conductive injection layer, and the first conductive injection layer is connected to the gate electrode.

In an example embodiment of the present disclosure, the first conductive injection layer and the first electrode layer are arranged in a same layer and made of a same material, the first conductive injection layer is connected with the first electrode layer, the second conductive injection layer and the second electrode layer are arranged in a same layer and made of a same material, and the second conductive injection layer and the second electrode layer are spaced apart.

In an example embodiment of the present disclosure, the first conductive injection layer and the first conductive layer are arranged in a same layer and made of a same material, the first conductive injection layer is connected to the drain electrode, the second conductive injection layer and the second electrode layer are arranged in a same layer and made of a same material, and the second conductive injection layer and the second electrode layer are spaced apart.

In an example embodiment of the present disclosure, the first organic switching unit further includes:
  a protective layer arranged between the gate insulating layer group and the gate layer and covering a sidewall of the organic active layer, wherein the passivation layer is arranged at a side of the protective layer away from the base substrate.

In an example embodiment of the present disclosure, the photodetection backplane further includes:
  an encapsulation layer covering the organic photodetector and arranged at a side of the passivation layer away from the base substrate, wherein the second electrode is arranged at a side of the encapsulation layer away from the base substrate.

In an example embodiment of the present disclosure, the photodetection backplane further includes:
  an encapsulation layer covering at least the organic photodetector.

In an example embodiment of the present disclosure, the encapsulation layer covers the organic photodetector and the first organic switching unit.

In an example embodiment of the present disclosure, the first conductive injection layer is a hole injection layer, the first conductive transport layer is a hole transport layer, the second conductive transport layer is an electron transport layer, and the second conductive injection layer is an electron injection layer; or the first conductive injection layer is an electron injection layer, the first conductive transport layer is an electron transport layer, the second conductive transport layer is a hole transport layer, and the second conductive injection layer is a hole injection layer.

In an example embodiment of the present disclosure, the photodetection backplane further includes:
  a second organic switching unit, wherein film layers of the second organic switching unit and corresponding film layers of the first organic switching unit are arranged in same layers and are made of same materials, respectively, and the second organic switching unit is used for controlling a display unit.

In an example embodiment of the present disclosure, the photodetection backplane further includes:
  a light-filtering layer arranged between the base substrate and the first organic switching unit as well as the organic photodetector, wherein there is no overlap between an orthographic projection of the light-filtering layer on the base substrate and orthographic projections of the first organic switching unit and the organic photodetector on the base substrate.

In an example embodiment of the present disclosure, the photodetection backplane further includes:
  a light-filtering layer arranged at a side of the first organic switching unit and the organic photodetector away from the base substrate.

In an example embodiment of the present disclosure, a first via hole is arranged in the organic planarization layer, and the organic active layer is connected to the source electrode through the first via hole, and is connected to the drain electrode through the first via hole; or, a first gap is provided between the source electrode and the drain electrode, the organic planarization layer includes a plurality of organic planarization portions spaced apart, the organic planarization portion is at least arranged in the first gap, and the organic planarization portion does not cover at least end portions of the source electrode and the drain electrode away from the first gap.

In an example embodiment of the present disclosure, an angle between a hole wall of the first via hole and a surface of the first conductive layer away from the base substrate is smaller than an angle between a sidewall of the first conductive layer and a surface of the first electrode layer close to the first conductive layer; or an angle between a sidewall of the organic planarization portion close to the first gap and a surface of the first conductive layer close to the organic planarization layer is smaller than an angle between a sidewall of the first conductive layer close to the first gap and the surface of the first electrode layer close to the first conductive layer.

In an example embodiment of the present disclosure, the angle between the hole wall of the first via hole and the surface of the first conductive layer away from the base substrate is smaller than or equal to 70°; or
  the angle between the sidewall of the organic planarization portion close to the first gap and the surface of the first conductive layer close to the organic planarization layer is smaller than or equal to 70°.

In an example embodiment of the present disclosure, the photodetection backplane is a flexible photodetection backplane.

According to another aspect of the present disclosure, there is provided a liquid crystal display panel, including: the photodetection backplane according to any one of the above embodiments In an example embodiment of the present disclosure, the liquid crystal display panel is a flexible liquid crystal display panel.

According to another aspect of the present disclosure, there is provided a liquid crystal display device, including: the liquid crystal display panel according to any one of the above embodiments, and the liquid crystal display device is a slidable and rollable display device, a foldable display device or a curved surface display device.

It should be understood that the foregoing general description and the following detailed description are exemplary and explanatory only, and are not intended to limit the present disclosure.

BRIEF DESCRIPTION OF THE DRAWINGS

The accompanying drawings, which are incorporated in and constitute a part of the specification, illustrate embodiments consistent with the present disclosure and together with the description, serve to explain the principles of the present disclosure. Obviously, the drawings in the following description are only some embodiments of the present disclosure. For those of ordinary skill in the art, other drawings may be obtained based on these drawings without exerting creative efforts.

LISTING OF REFERENCE NUMERALS

Figure 1:
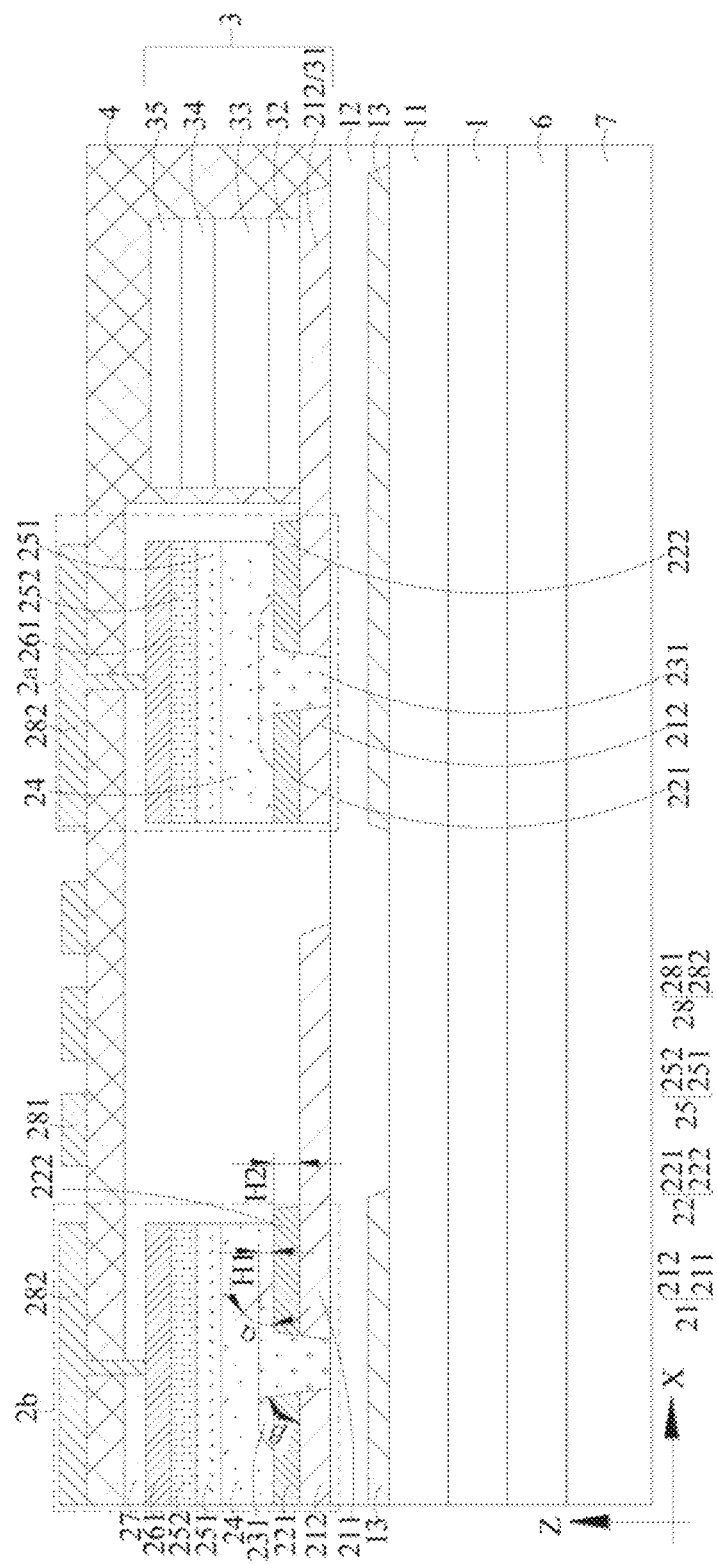
FIG. 1 is a schematic structural diagram of a photodetection backplane according to a first example implementation of the present disclosure.

1: base substrate; 11: first planarization layer; 12: second planarization layer; 13: light-shielding layer;
2a: first organic switching unit; 2b: second organic switching unit;
21: first electrode layer; 211: first electrode; 212: resistance-reducing connection portion;
22: first conductive layer; 221: source electrode; 222: drain electrode;
23: organic planarization layer; 231: organic planarization portion; 232: first via hole;
24: organic active layer;
25: gate insulating layer group; 251: first gate insulating layer; 252: second gate insulating layer;
26: gate layer; 261: gate electrode; 27: passivation layer;
28: second electrode layer; 281: second electrode; 282: gate connection portion; 283: connection line;
29: protective layer;
3: organic photodetector; 31: first conductive injection layer; 32: first conductive transport layer; 33: photoelectric conversion layer; 34: second conductive transport layer; 35: second conductive injection layer;
4: encapsulation layer;
5: light-filtering layer; 51: light-shielding portion; 52: light-filtering portion; 6: adhesive layer; 7: glass substrate;
X: first direction; Y: third direction.

DETAILED DESCRIPTION

Example implementations will now be described more fully with reference to the accompanying drawings. Example implementations may, however, be embodied in many forms and should not be construed as being limited to the implementations set forth herein; rather, these implementations are provided so that the present disclosure will be thorough and complete, and will fully convey the concept of example implementations to those skilled in the art. The same reference numerals in the drawings indicate the same or similar structures, and thus their detailed descriptions will be omitted. Furthermore, the drawings are merely schematic illustrations of the present disclosure and are not necessarily drawn to scale.

Although relative terms such as "upper" and "lower" are used in the specification to describe a relative relationship of one component shown in a drawing to another component, these terms are used in the specification only for convenience. For example, the terms are based on directions of examples described in the drawings. It will be understood that if a device shown in a drawing is turned upside down, a component described as "upper" would become a component which is "lower". When a structure is "on" other structure, it may mean that the structure is integrally formed on other structure, or that the structure is "directly" arranged on other structure, or that the structure is "indirectly" arranged on other structure through another structure.

The words "one", "a/an", "the", "said" and "at least one" are used in the specification to indicate the presence of one or more elements/components/etc.; the terms "comprising/comprises/comprise" and "having/has/have" are used to indicate an open-ended inclusion, and means that there may be additional elements/components/etc. in addition to the listed elements/components/etc. The words "first", "second" and "third" are used as markers only, but are not used to limit the number of objects.

In the present disclosure, unless otherwise clearly stated and limited, the term "connection" should be understood in a broad sense. For example, "connection" may be a fixed connection, a detachable connection, or being formed as an integral body; it may be a direct connection, or an indirect connection through an intermediation. The expression "and/or" is just an association relationship that describes related objects. It means that there may be three relationships. For example, A and/or B may mean three situations: A alone, B alone, and A and B exist simultaneously. In addition, the character "/" herein generally indicates that the related objects before and after the character are in an "or" relationship.

Example implementations of the present disclosure provide a photodetection backplane. Referring to FIGS. 1 to 16, the photodetection backplane may include a base substrate 1, a first organic switching unit 2a and an organic photodetector 3. The first organic switching unit 2a is arranged at a side of the base substrate 1. The organic photodetector 3 and the first organic switching unit 2a are arranged at the same side of the base substrate 1. The organic photodetector 3 is electrically connected to the first organic switching unit 2a. At least one film layer of the organic photodetector 3 and a film layer of the first organic switching unit 2a are arranged in a same layer and made of a same material.

In the photodetection backplane of the implementations of the present disclosure, on the one hand, both the first organic switching unit 2a and the organic photodetector 3 are made of an organic material, and the overall process temperature is smaller than 100° C., so that the photodetection backplane has sufficient flexibility and can be applied to flexible display panels. On the other hand, the organic photodetector 3 is electrically connected to the first organic switching unit 2a, and the organic photodetector 3 can be controlled through the first organic switching unit 2a. At least one film layer of the organic photodetector 3 and a film layer of the first organic switching unit 2a are arranged in the same layer and made of a same material, which reduces process steps and reduces costs.

In example implementations of the present disclosure, as shown in FIGS. 1 to 16, the photodetection backplane is a flexible photodetection backplane. Therefore, the base substrate 1 is a flexible substrate. The material of the base substrate 1 is a flexible material. Specifically, the material of the base substrate 1 may be a resinae material such as triacetate fiber thin film, polyimide, polycarbonate, polyacrylate, polyetherimide, polyethersulfone, polyethylene glycol terephthalate, polyethylene naphthalate and so on. The base substrate 1 may be formed of multiple material layers. For example, the base substrate 1 may include multiple base layers, and the material of the base layer may be any of the above-mentioned materials. Of course, the base substrate 1 may also be provided as a single layer, and may be made of any of the above materials.

In order to facilitate the preparation, transportation, etc. of the photodetection backplane, the base substrate 1 may be bonded to a glass substrate through an adhesive layer 6, and the glass substrate 7 is peeled off during use. Of course, when the photodetection backplane serves as a rigid base substrate 1, the glass substrate 7 does not need to be peeled off, or the glass substrate 7 does not need to be used, and other hard substrate(s) may be used.

A plurality of thin film transistors arranged in an array may be disposed at a side of the base substrate 1. A thin film transistor may at least includes a source electrode 221, a drain electrode 222, an organic active layer 24 and a gate electrode 261. The first organic switching unit 2a may include at least one thin film transistor, and the second organic switching unit 2b may include at least one thin film transistor. The following description is made by taking an example where each of the first organic switching unit 2a and the second organic switching unit 2b includes one thin film transistor.

Figure 14:
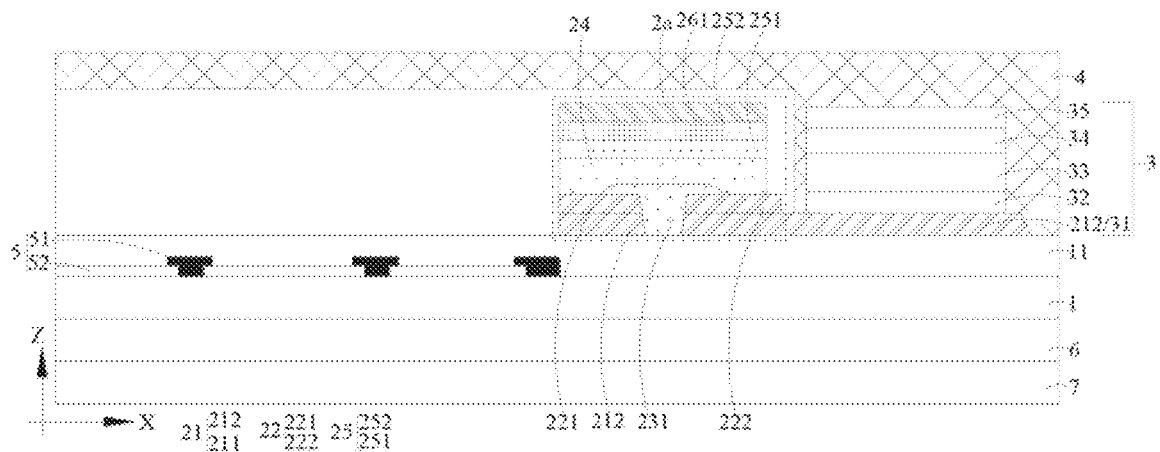
FIG. 14 is a schematic structural diagram of a photodetection backplane according to a fourteenth example implementation of the present disclosure.
Figure 15:
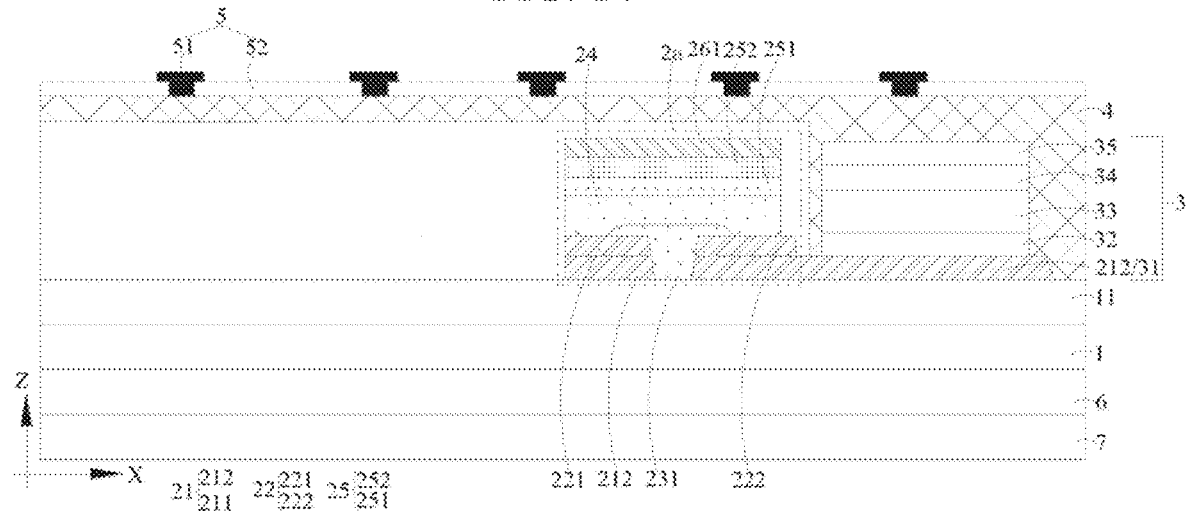
FIG. 15 is a schematic structural diagram of a photodetection backplane according to a fifteenth example implementation of the present disclosure.
Figure 16:
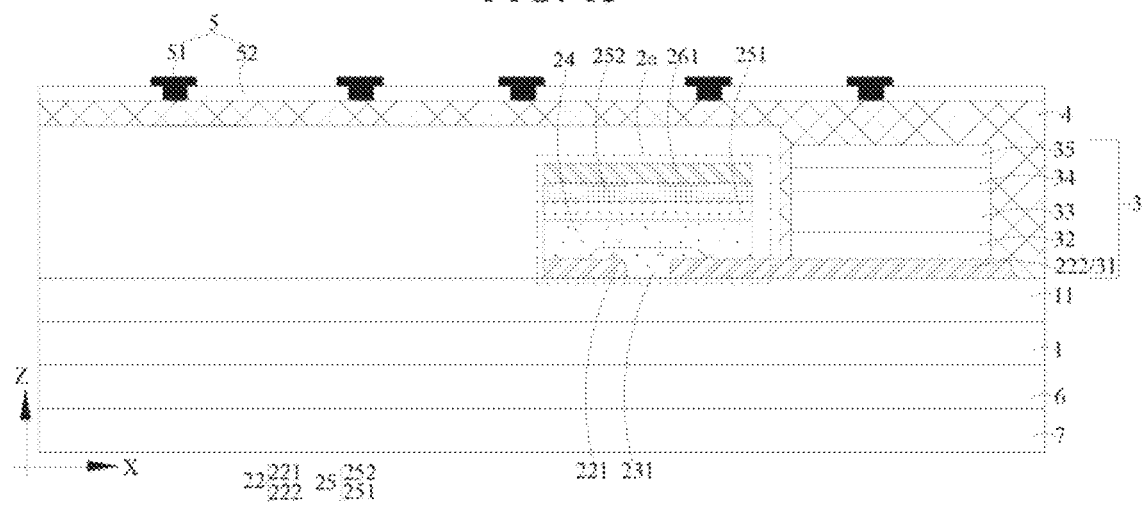
FIG. 16 is a schematic structural diagram of a photodetection backplane according to a sixteenth example implementation of the present disclosure.

The first organic switching unit 2a is used to control the organic photodetector 3 to realize a photodetection function. The second organic switching unit 2b is used to realize a display function. Referring to FIGS. 1 to 13, the first organic switching unit 2a and the organic photodetector 3 may be disposed on an array substrate, and together with the array substrate form a photodetection backplane. That is, the first organic switching unit 2a and the organic photodetector 3 may be disposed on the base substrate 1 together with the second organic switching unit 2b, and the photodetection backplane is reused as an array substrate. Referring to FIGS. 14 to 16, the first organic switching unit 2a and the organic photodetector 3 may be disposed on a color filter substrate, and together with the color filter substrate form a photodetection backplane, and the photodetection backplane is reused as the color filter substrate.

Referring to FIGS. 1 to 16, a first planarization layer 11 may be arranged at a side of the base substrate 1. The material of the first planarization layer 11 has strong adhesion, strong resistance to corrosion by chemical solvent(s), good planarization effect, and high light transmission; and the material of the first planarization layer 11 has low polarity to reduce channel effect and leakage current. The material of the first planarization layer 11 may be an epoxy resin photoresist, for example, SU-8 series epoxy resin photoresist.

Referring to FIGS. 1 to 13, a light-shielding layer 13 is arranged at a side of the first planarization layer 11 away from the base substrate 1. The light incident from the base substrate 1 side entering the organic active layer 24 and the photoelectric conversion layer 33 will generate photogenerated carriers in the organic active layer 24, which will have a huge impact on the characteristics of the thin film transistors and the organic photodetector 3, ultimately affecting the display quality of the display device and the accuracy of light detection by the organic photodetector 3. The light-shielding layer 13 can be used to shield the light incident from the base substrate 1 side, thereby avoiding the impact on the characteristics of the thin film transistors and the organic photodetector 3. Thus, influence on the display quality of the display device and the accuracy of light detection by the organic photodetector 3 can be avoided. Depending on the type of thin film transistors and organic photodetector 3, the light-shielding layer 13 may be omitted.

Referring to FIGS. 1 to 13, the light-shielding layer 13 may include a plurality of light-shielding portions which are spaced apart. One second organic switching unit 2b is provided with one corresponding light-shielding portion. One first organic switching unit and one organic photodetector are provided with one corresponding light-shielding portion. Of course, in some other example implementations of the present disclosure, the light-shielding layer 13 may include a plurality of strip-shaped light-shielding portions extending along a first direction X. One strip-shaped light-shielding portion may correspond to a plurality of first organic switching units 2a, a plurality of second organic switching units 2b and a plurality of organic photodetectors 3 arranged along the first direction X. That is, one strip-shaped light-shielding portion is used to shield a plurality of first organic switching units 2a, a plurality of second organic switching units 2b and a plurality of organic photodetectors 3 arranged along the first direction X.

Referring to FIGS. 1 to 13, a second planarization layer 12 may be arranged at a side of the light-shielding layer 13 away from the base substrate 1. The material of the second planarization layer 12 is an insulating material. The second planarization layer 12 may insulate the light-shielding layer 13 from the first conductive layer 22. The material of the second planarization layer 12 has strong adhesion, strong resistance to corrosion by chemical solvent(s), good planarization effect, and high light transmission; moreover, the polarity is low to reduce the channel effect and leakage current. Specifically, the material of the second planarization layer 12 may be an epoxy resin photoresist, for example, SU-8 series epoxy resin photoresist. The thickness of the second planarization layer 12 is greater than or equal to 1 micron.

Referring to FIGS. 14 to 16, when the photodetection backplane is reused as a color filter substrate, the photodetection backplane may not include the second planarization layer 12 and the light-shielding layer 13, and the light-filtering layer 5 may be used to shield light to a certain extent. Alternatively, the second planarization layer 12 and the light-shielding layer 13 may be provided.

In the example implementations, as shown in FIGS. 1 to 13, a first electrode layer 21 may be arranged at a side of the second planarization layer 12 away from the base substrate 1. The first electrode layer 21 may include a first electrode 211 and a resistance-reducing connection portion 212 which are spaced apart. The first electrode 211 may be a pixel electrode. Therefore, a plurality of first electrodes 211 are spaced apart. One sub-pixel is provided with one first electrode 211. The resistance-reducing connection portion 212 may be provided in a strip shape extending along a second direction. The material of the first electrode layer 21 may be a transparent conductive material, such as Indium Tin Oxide (ITO), Indium Zinc Oxide (IZO), etc.

Since the function of the first organic switching unit 2a is to turn on or turn off the organic photodetector 3, there is no need to provide the first electrode 211 and the second electrode 281. Therefore, the first organic switching unit 2a may include two resistance-reducing connection portions 212 which are spaced apart. Since the function of the second organic switching unit 2b is to control the orientation of the liquid crystal, the second organic switching unit 2b may include a first electrode 211 and a resistance-reducing connection portion 212 which are spaced apart.

Referring to FIG. 16, when the photodetection backplane is reused as a color filter substrate, the photodetection backplane may not be provided with the first electrode layer 21, and the first conductive layer 22 may be directly arranged on the first planarization layer 11. Alternatively, as shown in FIGS. 14 and 15, the first electrode layer 21 may also be provided.

In example implementations, a first conductive layer 22 may be arranged at a side of the first electrode layer 21 away from the base substrate 1. The first conductive layer 22 may include data lines (not shown in the figure), source electrodes 221 and drain electrodes 222. The data lines extend along the second direction Y. A part of a data line may be reused as a source electrode 221. Alternatively, a data line is connected with multiple source electrodes 221 arranged along the second direction Y. One data line may be used to input a data signal to multiple source electrodes 221 arranged along the second direction Y. A first gap is provided between A source electrode 221 and A drain electrode 222.

Since the first electrode layer 21 and the first conductive layer 22 are formed through the same patterning process and the first conductive layer 22 is located on the first electrode layer 21, the first electrode layer 21 necessarily exists between the first conductive layer 22 and the base substrate 1. That is, the area of the first electrode layer 21 is at least the same as the area of the first conductive layer 22, or the area of the first electrode layer 21 is larger than the area of the first conductive layer 22. Specifically, in the second organic switching unit 2b, an orthographic projection of the drain electrode 222 on the base substrate 1 overlaps with an orthographic projection of the first electrode layer 21 on the base substrate 1. For example, the orthographic projection of the first electrode layer 21 on the base substrate 1 covers the orthographic projection of the drain electrode 222 on the base substrate 1, and the area of the orthographic projection of the first electrode layer 21 on the base substrate 1 is larger than the area of the orthographic projection of the drain electrode 222 on the base substrate 1. Moreover, the orthographic projections of a source electrode 221 and a data line on the base substrate 1 are located within the orthographic projection of a resistance-reducing connection portion 212 on the base substrate 1. For example, the orthogonal projection of the resistance-reducing connection portion 212 on the base substrate 1 coincides with the orthographic projections of the source electrode 221 and the data line on the base substrate 1; or, the orthographic projection of the resistance-reducing connection portion 212 on the base substrate 1 covers the orthographic projections of the source electrode 221 and the data line on the base substrate 1, and the area of the orthographic projection of the resistance-reducing connection portion 212 on the base substrate 1 is larger than the area of the orthographic projections of the source electrode 221 and the data line on the base substrate 1.

In the first organic switching unit 2a, the orthographic projection of the drain electrode 222 on the base substrate 1 may coincide with the orthographic projection of a resistance-reducing connection portion 212 on the base substrate 1, and the orthographic projection of the source electrode 221 on the base substrate 1 coincides with the orthographic projection of a resistance-reducing connection portion 212 on the base substrate 1. When a part of the resistance-reducing connection portion 212 serves as a first conductive injection layer 31, the orthographic projection of the drain electrode 222 on the base substrate 1 is located within the orthographic projection of the resistance-reducing connection portion 212 on the base substrate 1, that is, the area of the resistance-reducing connection portion 212 is larger.

The thickness of the first conductive layer 22 is greater than or equal to 500 angstroms and smaller than or equal to 8000 angstroms. For example, the thickness of the first conductive layer 22 may be 650 angstroms, 982 angstroms, 1020 angstroms, 1190 angstroms, 1380 angstroms, 1850 angstroms, 2340 angstroms, 2840 angstroms, 3240 angstroms, 3840 angstroms, 4180 angstroms, 4586 angstroms, 5170 angstroms, 5760 angstroms, 6230 angstroms, 6840 angstroms, 7520 angstroms, or 7850 angstroms, and so on.

It should be noted that when thin film transistors with opposite polarities are used or when the current direction changes during circuit operation, the functions of a "source electrode 221" and a "drain electrode 222" may be interchanged with each other. Therefore, in this specification, "source electrode 221" and "drain electrode 222" may be interchanged with each other.

In example implementations, as shown in FIGS. 1 to 16, an organic planarization layer 23 may be arranged at a side of the first conductive layer 22 away from the base substrate 1. Specifically, the material of the organic planarization layer 23 needs to be resistant to chemical solvent(s), and may protect the first conductive layer 22; and, the material has high light transmittance to avoid affecting the light transmittance of the display panel; and the material has low polarity. Low polarity means that the dipole in the molecule is small, and the charge distribution is relatively uniform. Simply put, it is relatively symmetrical and generally has few lone pair electrons. Low polarity can reduce the polarization of induced charges, thereby reducing the back channel effect and reducing leakage current. For example, the material of the organic planarization layer 23 may be SU-8 series epoxy photoresist, or other materials with low dielectric constant may be selected.

Referring to FIGS. 1 to 12 and 14 to 16, the organic planarization layer 23 may include a plurality of organic planarization portions 231 which are spaced apart. That is, the organic planarization portions 231 are arranged in an island structure, and one thin film transistor may include one organic planarization portion 231.

An organic planarization portion 231 is at least arranged in the first gap, and the organic planarization portion 231 at least does not cover end portions of the source electrode 221 and the drain electrode 222 away from the first gap. This arrangement can guarantee the connection between the source electrode 221 and the drain electrode 222 and the organic active layer 24 even in a case where the source electrode 221 and the drain electrode 222 have a relatively small area, so that the area of the subsequently formed organic active layer 24 is relatively small and accordingly the area of the thin film transistor is relatively small. Thus, the aperture ratio of the entire photodetection backplane and display panel is increased.

The organic planarization portion 231 is not only disposed in the first gap, but also protrudes from the first conductive layer 22, so that a distance between the base substrate 1 and a surface of the organic planarization portion 231 away from the base substrate 1 is greater than a distance between the base substrate 1 and a surface of the first conductive layer 22 away from the base substrate 1. Moreover, a part of the organic planarization portion 231 is arranged at a side of the first conductive layer 22 away from the base substrate 1, that is, a part of the organic planarization layer 23 is arranged at a side of the source electrode 221 away from the base substrate 1. The organic planarization layer 23 also has a part arranged at a side of the drain electrode 222 away from the base substrate 1. In this way, the orthographic projection of the organic planarization portion 231 on the base substrate 1 overlaps with the orthographic projection of the source electrode 221 on the base substrate 1, and the orthographic projection of the organic planarization portion 231 on the base substrate 1 overlaps with the orthographic projection of the drain electrode 222 on the base substrate 1. Specifically, the width of the overlapping portion between the orthographic projection of the organic planarization portion 231 on the base substrate 1 and the orthographic projection of the source electrode 221 on the base substrate 1 is smaller than 5 microns, and the width of the overlapping portion between the orthogonal projection of the organic planarization portion 231 on the base substrate 1 and the orthographic projection of the drain electrode 222 on the base substrate 1 is also smaller than 5 microns. This can prevent the organic planarization portion 231 from covering the source electrode 221 and the drain electrode 222 more, which may result in that the connection between the subsequently formed organic active layer 24 and the source electrode 221 and the drain electrode 222 is unstable.

In addition, in order to avoid that the organic planarization portion 231 cannot fully fill the first gap when there is an error in the process or equipment, the width of the overlapping portion between the orthographic projection of the organic planarization portion 231 on the base substrate 1 and the orthographic projection of the source electrode 221 on the base substrate 1 may be greater than or equal to 2 microns, for example, the width may be 2.5 microns, 2.85 microns, 3.1 microns, 3.6 microns, 4.25 microns, or 4.7 microns, etc. In the same way, the width of the overlapping portion between the orthographic projection of the organic planarization portion 231 on the base substrate 1 and the orthographic projection of the drain electrode 222 on the base substrate 1 is also greater than or equal to 2 microns, for example, the width may be 2.5 microns, 2.85 microns, 3.1 microns, 3.6 microns, 4.25 microns, or 4.7 microns, etc. Of course, other values may be possible depending on the accuracy of the product and process equipment.

This arrangement allows the organic planarization portion 231 to fully fill the first gap between the source electrode 221 and the drain electrode 222, and allows the organic planarization portion 231 to completely cover sharp portions of the corners of the source electrode 221 and the drain electrode 222. In this way, the subsequent formed organic active layer 24 does not need to climb on the sidewalls of the source electrode 221 and the drain electrode 222, so that gaps in the organic active layer 24 can be avoided and breakage due to gaps can also be avoided. Moreover, this arrangement requires low process and equipment accuracy, and even if an error occurs during the preparation process and the position of the organic planarization portion 231 is shifted, the organic planarization portion 231 can fully fill the first gap between the source electrode 221 and the drain electrode 222, and the organic planarization portion 231 can completely cover the sharp portions of the corners of the source electrode 221 and the drain electrode 222.

Moreover, a distance H1 between the surface of the organic planarization portion 231 away from the base substrate 1 and the first conductive layer 22 is smaller than the thickness H2 of the first conductive layer 22 in the third direction Z. That is, the height of the portion of the organic planarization portion 231 which protrudes from the first conductive layer 22 is smaller than the thickness of the first conductive layer 22. The third direction Z is perpendicular to the surface of the base substrate 1 close to the first electrode layer 21. The subsequently formed organic active layer 24 is allowed to climb on the sidewall of the organic planarization portion 231, but the climbing height is small, thereby avoiding gaps in the organic active layer 24 and preventing breakage due to gaps. Of course, in some other example implementations of the present disclosure, the distance H1 between the surface of the organic planarization portion 231 away from the base substrate 1 and the first conductive layer 22 may also be equal to or greater than the thickness H2 of the first conductive layer 22 in the third direction Z.

Furthermore, an angle $\alpha$ between a sidewall of the organic planarization layer 23 close to the first gap and a surface of the first conductive layer 22 close to the organic planarization layer 23 is smaller than an angle $\beta$ between a sidewall of the first conductive layer 22 close to the first gap and a surface of the first electrode layer 21 close to the first conductive layer 22. That is, the inclination angle of the sidewall of the organic planarization layer 23 is smaller than the inclination angle of the sidewalls of the source electrode 221 and the drain electrode 222 in the first conductive layer 22. Specifically, the angle $\alpha$ between the sidewall of the organic planarization portion 231 close to the first gap and the surface of the first conductive layer 22 away from the base substrate 1 is smaller than or equal to 70°. That is, although the organic planarization portion 231 has a sidewall, the slope of the sidewall of the organic planarization portion 231 is gentle, and even if the organic active layer 24 which is formed later climbs the sidewall of the organic planarization portion 231, no gaps will appear and breakage due to the gaps can be avoided.

In addition, the material of the organic planarization portion 231 is an organic material, and the corners of the organic planarization portion 231 are relatively rounded. The corners of the organic planarization portion 231 may be arc surfaces. That is, the surface of the organic planarization portion 231 away from the base substrate 1 and the sidewalls may be connected through arc surfaces, and a sharp corner structure is not formed at the corners of the source electrode 221 and the drain electrode 222. Therefore, the subsequently formed organic active layer 24 has good coverage at the corners of the organic planarization portion 231 and will not cause breakage defects at the corners and the bent portions. Of course, in some other example implementations of the present disclosure, the surface of the organic planarization portion 231 away from the base substrate 1 and the sidewalls of the organic planarization portion 231 may also be directly connected to form an obtuse angle.

Moreover, the angle between the sidewall of the organic planarization layer 23 close to the first gap and the surface of the first conductive layer 22 away from the base substrate 1 cannot be too small. If this angle is too small, the area of the organic planarization portion 231 will be larger. As a result, the area of the subsequently formed organic active layer 24 is larger, resulting in a larger area of the entire thin film transistor, which affects the aperture ratio of the display panel. Specifically, the angle between the sidewall of the organic planarization layer 23 close to the first gap and the surface of the first conductive layer 22 away from the base substrate 1 is greater than or equal to 30 degrees. For example, the angle between the sidewall of the organic planarization layer 23 close to the first gap and the surface of the first conductive layer 22 away from the base substrate 1 may be 32 degrees, 36 degrees, 42.5 degrees, 46.8 degrees, 51 degrees, 54.7 degrees, 58.4 degrees, 62 degrees, 65.3 degrees, 67.5 degrees, and so on.

The thickness of the organic planarization layer 23 is greater than or equal to 300 nanometers and smaller than or equal to 800 nanometers. For example, the thickness of the organic planarization layer 23 may be 326 nanometers, 375 nanometers, 430 nanometers, 480 nanometers, 517 nanometers, 589 nanometers, 625 nanometers, or 673 nanometers, 741 nanometer, 789 nanometer, and so on.

Figure 13:
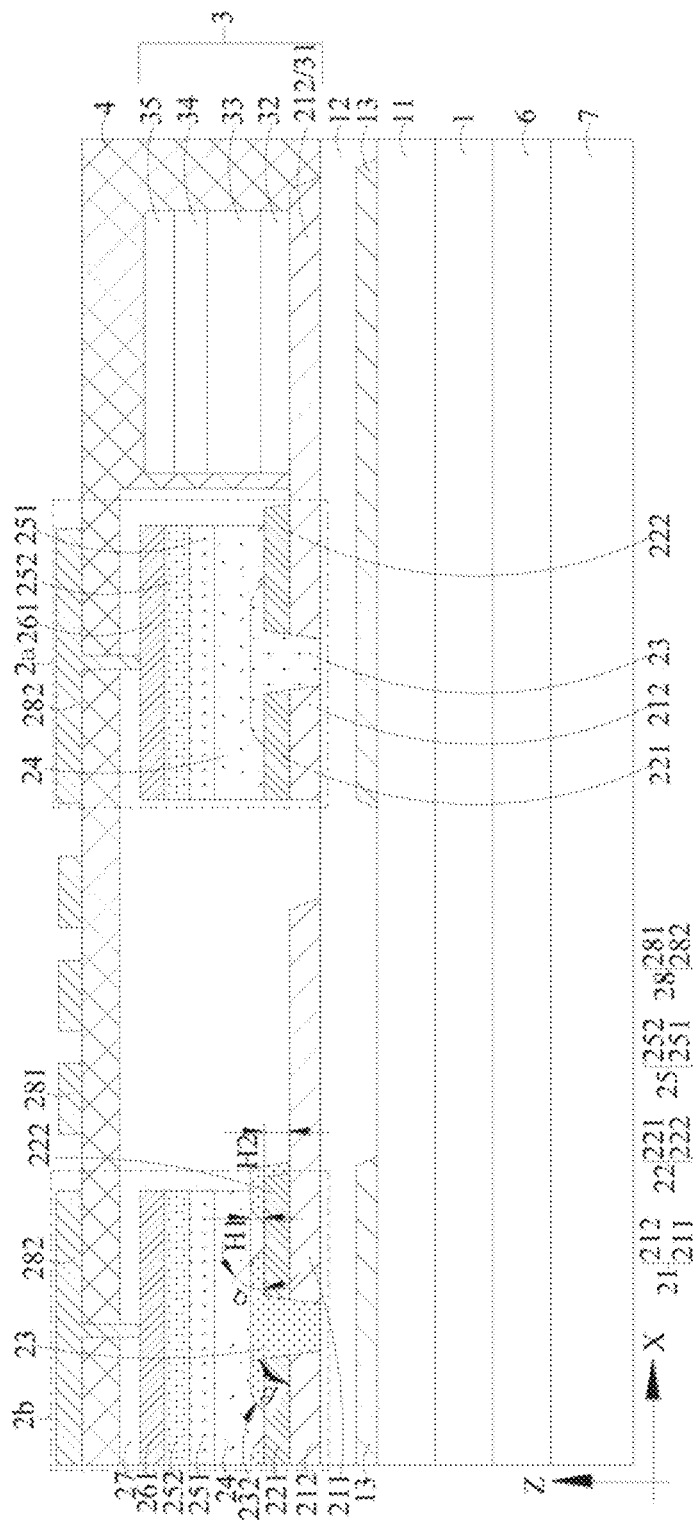
FIG. 13 is a schematic structural diagram of a photodetection backplane according to a thirteenth example implementation of the present disclosure.

Referring to FIG. 13, at least one first via hole 232 may be arranged in the organic planarization layer 23. The subsequently formed organic active layer 24 is connected to the source electrode 221 through a first via hole 232, and is connected to the drain electrode 222 through a first via hole 232. Moreover, an angle between a hole wall of the first via hole 232 and the surface of the first conductive layer 22 away from the base substrate 1 is smaller than the angle between the sidewall of the first conductive layer 22 and the surface of the first electrode layer 21 close to the first conductive layer 22. Specifically, the angle between the hole wall of the first via hole 232 and the surface of the first conductive layer 22 away from the base substrate 1 is smaller than or equal to 70°.

In the example implementations, as shown in FIGS. 1 to 16, the organic active layer may be arranged at a side of the organic planarization layer 23 away from the base substrate 1. The organic active layer 24 is connected with the source electrode 221 and the drain electrode 222. The material of the organic active layer 24 may be an organic semiconductor (OSC) material.

The orthographic projection of the organic active layer 24 on the base substrate 1 is located within the orthographic projection of the light-shielding layer 13 on the base substrate 1, so that the light-shielding layer 13 can block light from reaching the organic active layer 24. Specifically, the orthographic projection of the organic active layer 24 on the base substrate 1 may coincide with the orthographic projection of the light-shielding layer 13 on the base substrate 1; or, the orthographic projection of the light-shielding layer 13 on the base substrate 1 covers the orthographic projection of the organic active layer 24 on the base substrate 1, and the area of the orthographic projection of the light-shielding layer 13 on the base substrate 1 is larger than the area of the orthographic projection of the organic active layer 24 on the base substrate 1. For example, a distance between an edge line of the orthographic projection of the light-shielding layer 13 on the substrate 1 and an edge line of the orthographic projection of the organic active layer 24 on the base substrate 1 is greater than or equal to 2 microns. This arrangement ensures that the orthographic projection of the organic active layer 24 on the base substrate 1 can be located within the orthographic projection of the light-shielding layer 13 on the base substrate 1 even if there is an error in the process or equipment.

Due to the planarization and protection functions of the organic planarization layer 23, the material selection space of the first conductive layer 22 is larger, so that the flexible photodetection backplane can be mass-produced. Furthermore, because the organic semiconductor (OSC) material of the organic active layer 24 is a P-type material, the first conductive layer 22 needs to form ohmic contact with the organic active layer 24. It is needed to select a material with a larger work function for the first conductive layer 22. For example, the work function of the material of the first conductive layer 22 needs to be greater than 4.5 eV. Therefore, by taking the work function into consideration, the material of the first conductive layer 225 may be Ag+SAM, whose work function is about 5.86 eV, and Ag is closer to the base substrate 1; or, the material may be Indium Tin Oxide (ITO), whose work function is greater than or equal to 4.57 eV and smaller than or equal to 4.93 eV; or, the material may be Mo+surface oxidation (molybdenum oxide), whose work function is about 5.58 eV, Mo is closer to the base substrate 1; or, the material may be Mo alloy+surface oxidation (molybdenum oxide), whose work function is about 5.5 eV, and the Mo alloy is closer to the base substrate 1; or, the material may be TiN, whose work function is greater than or equal to 4.49 e V and smaller than or equal to 5.29 eV; or, the material may be Au, whose work function is about 5.2 eV; or, the material may be Pt, whose work function is about 5.6 eV; or, the material may be Pd, whose work function is about 5.12 eV, and so on.

Taking the conductive performance into consideration, the first conductive layer 22 may be of a stacked form. For example, the first conductive layer 22 may include a Buffer Film (BF), a Low Resistance Film (LRF) and a High Work Function Film (HWF) which are stacked in sequence, and the buffer film is closer to the base substrate 1. The buffer films may be made of a material selected from: Mo, Mo alloy, Ti, ITO, Indium Zinc Oxide (IZO), etc. The low resistance film may be made of a material selected from: Cu, Al, Ag, etc. The high work function film may be Ag+SAM, whose work function is about 5.86 eV; or, the high work function film may be Indium Tin Oxide (ITO), whose work function is greater than or equal to 4.57 eV and smaller than or equal to 4.93 eV; or, the high work function film may be Mo+surface oxidation (molybdenum oxide), whose work function is about 5.58 eV, Mo is closer to the base substrate 1; or, the high work function film may be Mo alloy+surface oxidation (molybdenum oxide), whose work function is about 5.5 eV, Mo alloy is closer to the base substrate 1; or, the high work function film may be TiN, whose work function is greater than or equal to 4.49 eV and smaller than or equal to 5.29 eV; or, the high work function film may be Au, whose work function is about 5.2 eV; or, the high work function film may be Pt, whose work function is about 5.6 eV; or, the high work function film may be Pd, whose work function is about 5.12 eV, and so on.

SAM is a self-assembled monolayer film, which may form a single molecular layer, modify the interface between the first conductive layer 22 and the organic active layer 24, and improve the work function.

In the related art, the material of the first conductive layer 22 is a stacked structure of MoAlMo or a stacked structure of MoNd/Cu/MoNd. Since the surface is made of Mo or Mo alloy material, the work function is small (≤4.5 eV), which does not meet the layer requirements. In the present disclosure, surface oxidation treatment is performed, and the treatment methods include annealing, plasma, etc., so that the work function is increased to greater than or equal to 4.5 eV, and the temperature of the surface oxidation treatment process is relatively low, generally not exceeding 100° C.

In example implementations, as shown in FIGS. 1 to 16, a gate insulating layer group 25 may be arranged at a side of the organic active layer 24 away from the base substrate 1. The orthographic projection of the gate insulating layer group 25 on the base substrate 1 coincides with the orthographic projection of the organic active layer 24 on the base substrate 1, that is, the orthographic projection of the gate insulating layer group 25 on the base substrate 1 and the orthographic projection of the organic active layer 24 on the base substrate 1 completely overlap with each other, so that the gate insulating layer group 25 and the organic active layer 24 may be formed through the same patterning process, which reduces process steps and costs.

Referring to FIGS. 1 to 16, the gate insulating layer group 25 may include a first gate insulating layer 251 and a second gate insulating layer 252. The first gate insulating layer 251 is arranged at a side of the organic active layer 24 away from the substrate 1. The first gate insulating layer 251 needs to be a flexible film layer with an insulation property; and it is orthogonal to the solvent used to etch the organic active layer 24 and has good matching performance, that is, the material of the first gate insulating layer 251 does not react with the material of the organic active layer 24 to ensure the channel characteristic of the organic active layer 24. Specifically, for example, the material of the first gate insulating layer 251 may be a material with a low dielectric constant.

It should be noted that orthogonal solvents refer to solvents with greatly different polarities. An orthogonal solvent system is a solvent system used for the application of subsequent layer(s), and in the orthogonal solvent system, the previously applied layer(s) is (are) insoluble.

The second gate insulating layer 252 is arranged at a side of the first gate insulating layer 251 away from the base substrate 1. The blocking performance of the second gate insulating layer 252 against the etching liquid of the gate layer 26 is stronger than the blocking performance of the first gate insulating layer 251 against the etching liquid of the gate layer 26. The second gate insulating layer 252 needs to be a flexible film layer, has an insulation property and good environmental stability, and may block water and oxygen. The second gate insulating layer 252 may be a cross-linked material. The cross-linked material is a material that has undergone a cross-linking reaction. The cross-linking reaction refers to a reaction where two or more molecules (generally linear molecules) are bonded and cross-linked to each other to form a more reliable molecule (three-dimensional molecule) having a network structure. This reaction converts linear or lightly branched macromolecules into a three-dimensional network structure, thereby improving strength, heat resistance, wear resistance, solvent resistance and other properties. Specifically, for example, the material of the second gate insulating layer 252 may be a cross-linkable dielectric material that can improve electrical durability.

A gate layer 26 may be arranged at a side of the gate insulating layer group 25 away from the base substrate 1. The gate layer 26 may include a gate electrode 261. As shown in FIGS. 1 to 10 and FIGS. 13 to 16, the orthographic projection of the gate layer 26 on the base substrate 1 coincides with the orthographic projection of the organic active layer 24 on the base substrate 1. That is, the orthographic projection of the gate layer 26 on the base substrate 1 completely overlaps with the orthographic projection of the organic active layer 24 on the base substrate 1, so that the gate layer 26 and the organic active layer 24 may be formed through the same patterning process, which reduces process steps and costs.

It should be noted that the so-called "overlapping" does not mean complete overlapping, but there is a certain error. Depending on the equipment and preparation process, the error range is also different. Therefore, overlapping within the error range of the equipment and preparation process may be considered to be an overlapping.

The gate layer 26, the gate insulating layer group 25 and the organic active layer 24 are formed through the same patterning process. In a case where only the first gate insulating layer 251 is provided, since the first gate insulating layer 251 and the organic active layer 24 have poor blocking performance, when etching the gate material layer, the etching liquid may easily pass through the first gate insulating layer 251 and the organic active layer 24 to corrode the first conductive layer 22. When the gate insulating layer group 25 includes the first gate insulating layer 251 and the second gate insulating layer 252, the blocking performance of the second gate insulating layer 252 against the etching liquid of the gate layer 26 is stronger than the blocking performance of the first gate insulating layer 251 against the etching liquid of the gate layer 26, during the etching process of the gate material layer, the second gate insulating material layer can protect the first conductive layer 22 to prevent the etching liquid of the gate layer 26 from corroding the first conductive layer 22 and ensure the electrical property of the first conductive layer 22, thereby ensuring the performance of the photodetection backplane.

Therefore, during the process of etching to form the gate layer 26, the gate layer 26 may protect the gate insulating layer group 25 and the organic active layer 24 below it to prevent the etching liquid of the gate layer 26 from corrode the first conductive layer 22. Therefore, the material selection space of the gate layer 26 is large, and thus the flexible photodetection backplane can be mass-produced. For example, the material of the gate layer 26 may be Ag, Mo, Cu, Al, Ti, ITO, a stacked structure of ITO/Ag/ITO, a stacked structure of Mo/Al/Mo, a stacked structure of Mo/Cu/Mo, or a stacked structure of Ti/Al/Ti, etc.

In example implementations, as shown in FIGS. 1 to 10 and FIGS. 13 to 16, a passivation layer 27 may be arranged at a side of the gate layer 26 away from the base substrate 1. The passivation layer 27 needs to be a flexible film layer, has an insulation property and good environmental stability, and may block water and oxygen. Specifically, it may be a cross-linked material. The material of the passivation layer 27 may be the same as the material of the second gate insulating layer 252.

A via hole is provided in the passivation layer 27, and the via hole is connected to the gate electrode 261.

Referring to FIGS. 1 to 13, a second electrode layer 28 may be arranged at a side of the passivation layer 27 away from the base substrate 1. The material of the second electrode layer 28 may be a transparent conductive material, such as Indium Tin Oxide (ITO), Indium Zinc Oxide (IZO), etc. The second electrode layer 28 includes second electrodes 281 and gate connection portions 282 which are spaced apart. The second electrodes 281 may be a common electrode. Therefore, multiple second electrodes 281 need to be connected together, and the gate connection portions 282 need to be connected to gate electrodes 261. Therefore, the second electrodes 281 and the gate connection portion 282 need to be spaced apart. The specific structure may be providing the second electrode layer 28 by forming multiple openings in the second electrode layer 28, and the gate connection portions 282 are provided in the multiple openings.

A gate connection portion 282 may extend along the first direction X. The gate connection portion 282 is connected to two adjacent gate electrodes through via hole(s) in the passivation layer 27. Multiple gate electrodes arranged along the first direction X are connected together through multiple gate connection portions 282, and the gate connection portions serve as gate lines to provide scan signals to respective gate electrodes 261.

In some other example implementations of the present disclosure, the second electrodes 281 may be provided in a strip shape extending along the first direction X, and the gate connection portions 282 may be provided in a strip shape extending along the first direction X. The second electrodes 281 and the gate connection portions 282 may be arranged alternately in the second direction. That is, one gate connection portion 282 is provided between two adjacent second electrodes 281, and one second electrode 281 is provided between two adjacent gate connection portions 282. The multiple second electrodes 281 may be connected in the peripheral area. Of course, the multiple second electrodes 281 may also be bridged by other conductive film layer(s).

A gate connection portion 282 alone serves as a gate line. The gate connection portion 282 may extend along the first direction X. The gate connection portion 282 is connected to two adjacent gate electrodes 261 through via holes in the passivation layer 27. Multiple gate electrodes 261 arranged along the first direction X are connected together through multiple gate connection portions 26, and the multiple gate connection portions 282 serve as gate lines to provide scan signals to respective gate electrodes 261.

It should be noted that since the function of the first organic switching unit 2a is to turn on or turn off the organic photodetector 3, there is no need to provide the first electrode 211 and the second electrode 281, the first organic switching unit 2a may include a gate connection portion 282 and does not include a second electrode 281. Since the function of the second organic switching unit 2b is to control the orientation of the liquid crystal, the second organic switching unit 2b may include the second electrode 281 and gate connection portion 282 that are spaced apart.

Figure 11:
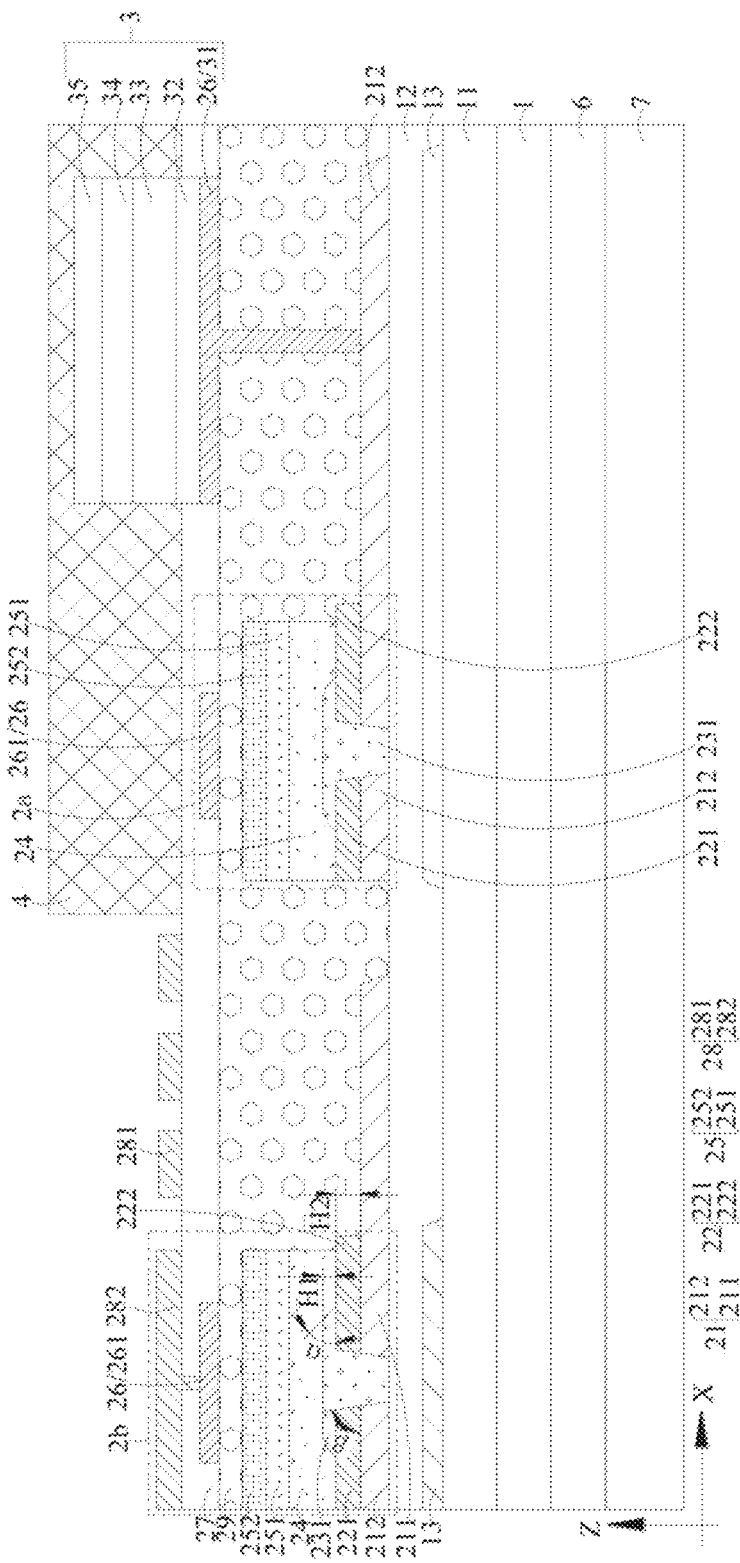
FIG. 11 is a schematic structural diagram of a photodetection backplane according to an eleventh example implementation of the present disclosure.
Figure 12:
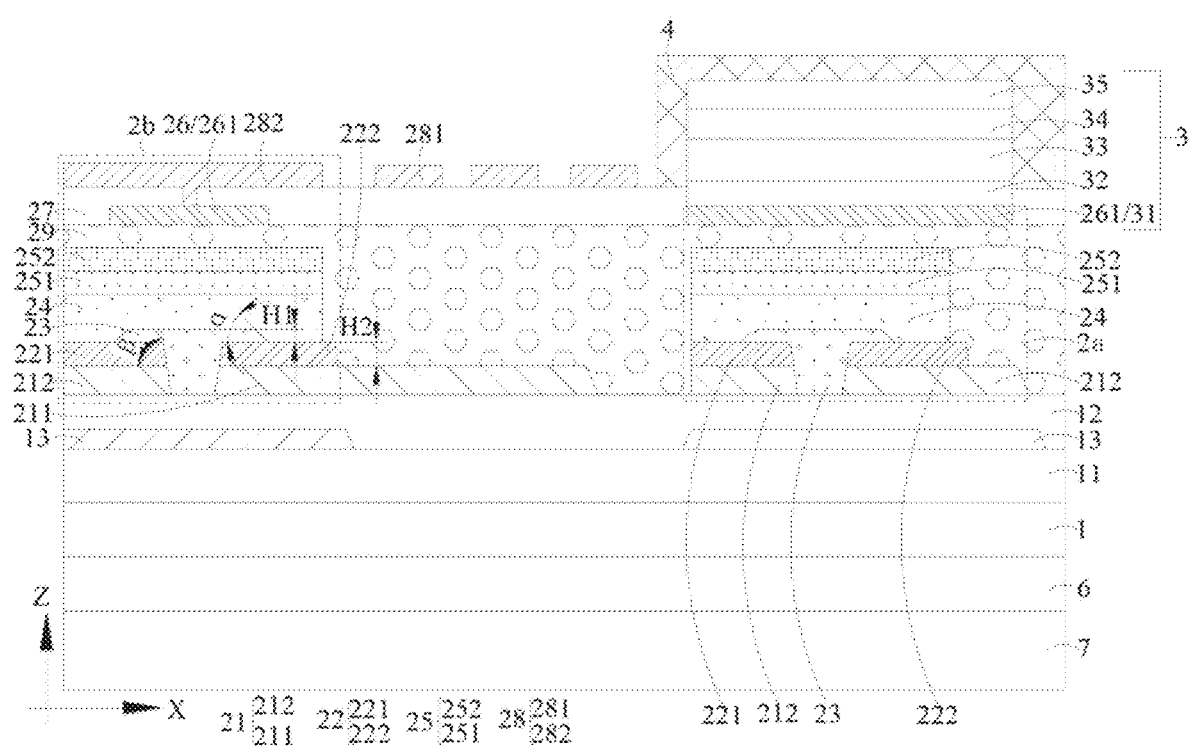
FIG. 12 is a schematic structural diagram of a photodetection backplane according to a twelfth example implementation of the present disclosure.

Further, referring to FIG. 11 and FIG. 12, the photodetection backplane may also include a protective layer 29. The protective layer 29 covers at least the sidewalls of the organic active layer 24, and the protective layer 29 can protect the organic active layer 24.

In example implementations, the protective layer 29 is disposed between the gate insulating layer group 25 and the gate layer 26 and covers the sidewalls of the organic active layer 24 and the gate insulating layer group 25. That is, before the gate layer 26 is formed, the protective layer 29 is formed. During the patterning process to form the gate layer 26, the protective layer 29 can protect the organic active layer 24 and prevent the etching liquid of the gate layer 26 from corroding the organic active layer 24. This makes the selection space for the gate material larger. For example, the material of the gate layer 26 may be Ag, Mo, Cu, Al, Ti, ITO, a stacked structure of ITO/Ag/ITO, a stacked structure of Mo/Al/Mo, a stacked structure of Mo/Cu/Mo, or a stacked structure of Ti/Al/Ti, etc.

The thickness of the protective layer 29 is greater than or equal to 1000 angstroms and smaller than or equal to 3000 angstroms. For example, the thickness of the protective layer 29 may be 1030 angstroms, 1085 angstroms, 1162 angstroms, 1238 angstroms, 1348 angstroms, 1586 angstroms, 1651 angstroms, 1752 angstroms, 1830 angstroms, 1985 angstroms, 2162 angstroms, 2338 angstroms, 2481 angstroms, 2568 angstroms, 2615 angstroms, 2725 angstroms, 2856 angstroms, or 2965 angstroms and so on.

The material of the protective layer 29 may be the same as the material of the passivation layer 27 or the second planarization layer 12. The specific requirements for the material of the passivation layer 27 and the material of the second planarization layer 12 have been described in detail above. Therefore, repeated descriptions are omitted here.

In this case, the gate layer 26 and the organic active layer 24 may be formed through different patterning processes. Therefore, the gate layer 26 may include gate lines (not shown in the figure) and gate electrodes 261, and the size of gate electrodes 261 can be further reduced. In this way, the orthographic projection of a gate electrode 261 on the base substrate 1 is located within the orthographic projection of an organic active layer 24 on the base substrate 1. For example, the orthographic projection of the organic active layer 24 on the base substrate 1 covers and is larger than the orthographic projection of the gate electrode 261 on the base substrate 1, so that the organic active layer 24 protrudes beyond the gate electrode 261. Specifically, the width of the gate electrode 261 in the first direction X is approximately 4 microns. The area of the gate electrode 261 is reduced, thus reducing the overlapping area between the gate electrode 261 and the first conductive layer 4 and reducing the capacitance Cgs between the gate electrode 261 and the source electrode 41 and the capacitance Cgd between the gate electrode 261 and the drain electrode 222, and thus reducing power consumption.

Furthermore, the portion of the organic active layer 24 that protrudes beyond the gate electrode 261 may be conductorized, so that the organic active layer 24 may include a channel portion and two conductor portions, and the two conductor portions are disposed on opposite sides of the channel portion. The channel portion is a semiconductor. The orthographic projection of the channel portion on the base substrate 1 coincides with the orthographic projection of the gate electrode 261 on the base substrate 1. There is no overlapping between the orthographic projections of the conductor portions on the base substrate 1 and the orthographic projection of the gate electrode 261 on the base substrate 1.

The organic active layer 24 may be subjected to plasma or doping treatment with acid gas. The acid gas may include carbon dioxide ($CO_2$), chlorine ($Cl_2$), hydrogen sulfide ($H_2S$), nitrogen dioxide ($NO_2$), hydrogen chloride (HCl), sulfur dioxide ($SO_2$), etc.

In this case, a gate connection portion 282 may be connected to a gate electrode 261 through a via hole in the passivation layer 27 and a via hole in the protective layer 29, and the via hole in the passivation layer 27 and the via hole in the protective layer 29 may be formed by the same patterning process.

Referring to FIGS. 14 and 16, when the photodetection backplane is reused as a color filter substrate, the second electrode layer 28 may not be provided in the photodetection backplane.

Referring to FIGS. 1 to 16, the organic photodetector 3 may include a first conductive injection layer 31, a first conductive transport layer 32, a photoelectric conversion layer 33, a second conductive transport layer 34 and a second conductive injection layer 35. The first conductive injection layer 31 and the first organic switching unit 2a are arranged at the same side of the base substrate 1. The first conductive transport layer 32 is arranged at a side of the first conductive injection layer 31 away from the base substrate 1. The photoelectric conversion layer 33 is arranged at a side of the first conductive transport layer 32 away from the base substrate 1. The second conductive transport layer 34 is arranged at a side of the photoelectric conversion layer 33 away from the base substrate 1. The second conductive injection layer 35 is arranged at a side of the second conductive transport layer 34 away from the base substrate 1.

The correspondence relationship between filter layers of the organic photodetector 3 and the first organic switching unit 2a will be described in detail below.

Referring to FIGS. 1 and 13, the first conductive injection layer 31 and the first electrode layer 21 may be arranged in the same layer and made of the same material, and the first conductive injection layer 31 is connected to the first electrode layer 21. The area of the resistance-reducing connection portion 212 in the first electrode layer 21 which is connected to the drain electrode 222 is set to be relatively large, a part of the resistance-reducing connection portion 212 is connected to the drain electrode 222, and the other part of the resistance-reducing connection portion 212 serves as the first conductive injection layer 31. The first conductive transport layer 32, the photoelectric conversion layer 33, the second conductive transport layer 34 and the second conductive injection layer 35 are sequentially stacked at a side of the first conductive injection layer 31 away from the base substrate 1. In this way, the organic photodetector 3 is arranged side by side with the first organic switching unit 2a and the second organic switching unit 2b at the same side of the base substrate 1.

It should be noted that "A" and "B" being arranged in the same layer and being made of the same material means that "A" and "B" are formed through a same patterning process, and "A" and "B" may be directly connected as an integral structure, or "A" and "B" may be spaced apart.

The first conductive injection layer 31 may be a hole injection layer, the first conductive transport layer 32 may be a hole transport layer, the second conductive transport layer 34 may be an electron transport layer, and the second conductive injection layer 35 may be an electron injection layer. Alternatively, in some other example implementations of the present disclosure, the first conductive injection layer 31 may be an electron injection layer, the first conductive transport layer 32 may be an electron transport layer, the second conductive transport layer 34 may be a hole transport layer, and the second conductive injection layer 35 may be a hole injection layer.

An encapsulation layer 4 is arranged at a side of the organic photodetector 3 and the passivation layer 27 away from the base substrate 1. That is, the encapsulation layer 4 covers all of the organic photodetector 3, the first organic switching unit 2a and the second organic switching unit 2b (except the second electrode layer 28). The encapsulation layer 4 plays a role of isolating water and oxygen and protecting the organic photodetector 3.

The second electrode layer 28 is arranged at a side of the encapsulation layer 4 away from the base substrate 1. The second electrode layer 28 may include a second electrode 281 and a gate connection portion 282. The second electrode 281 and the gate connection portion 282 are spaced apart. The second electrode 281 may be a common electrode, and the gate connection portion 282 may be connected to a gate electrode through a via hole in the passivation layer 27 and a via hole in the encapsulation layer 4 to provide a scan signal to the gate electrode.

Figure 2:
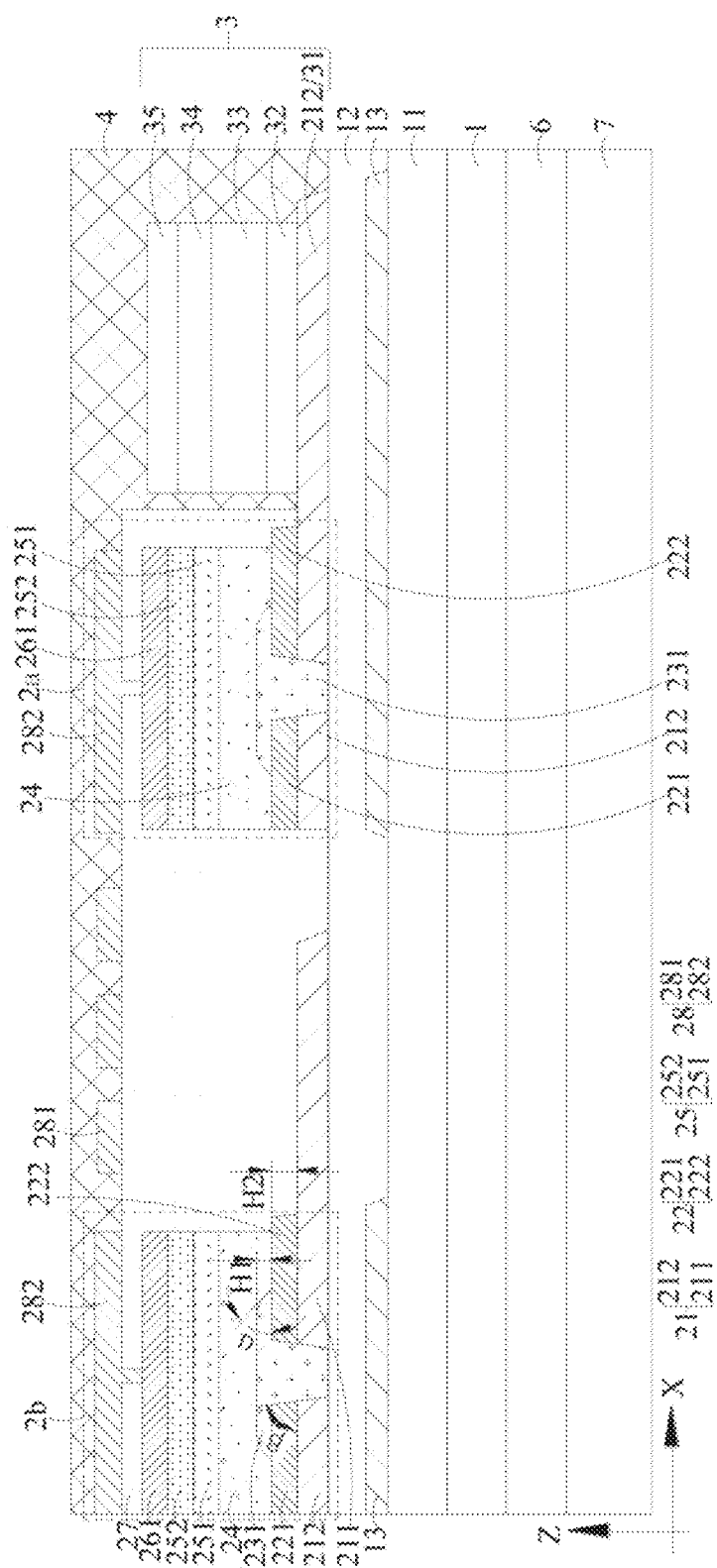
FIG. 2 is a schematic structural diagram of a photodetection backplane according to a second example implementation of the present disclosure.

In addition, referring to FIG. 2, in some other example implementations of the present disclosure, the second electrode layer 28 may be arranged at a side of the passivation layer 27 away from the base substrate 1. The second electrode layer 28 may include a second electrode 281 and a gate connection portion 282. The second electrode 281 and the gate connection portion 282 are spaced apart. The second electrode 281 may be a common electrode, and the gate connection portion 282 may be connected to a gate electrode through a via hole in the passivation layer 27 to provide a scan signal to the gate electrode. In this case, the encapsulation layer 4 may be arranged at a side of the organic photodetector 3 and the second electrode layer 28 away from the base substrate 1. That is, the encapsulation layer 4 covers all of the organic photodetector 3, the first organic switching unit 2a and the second organic switching unit 2b.

Figure 3:
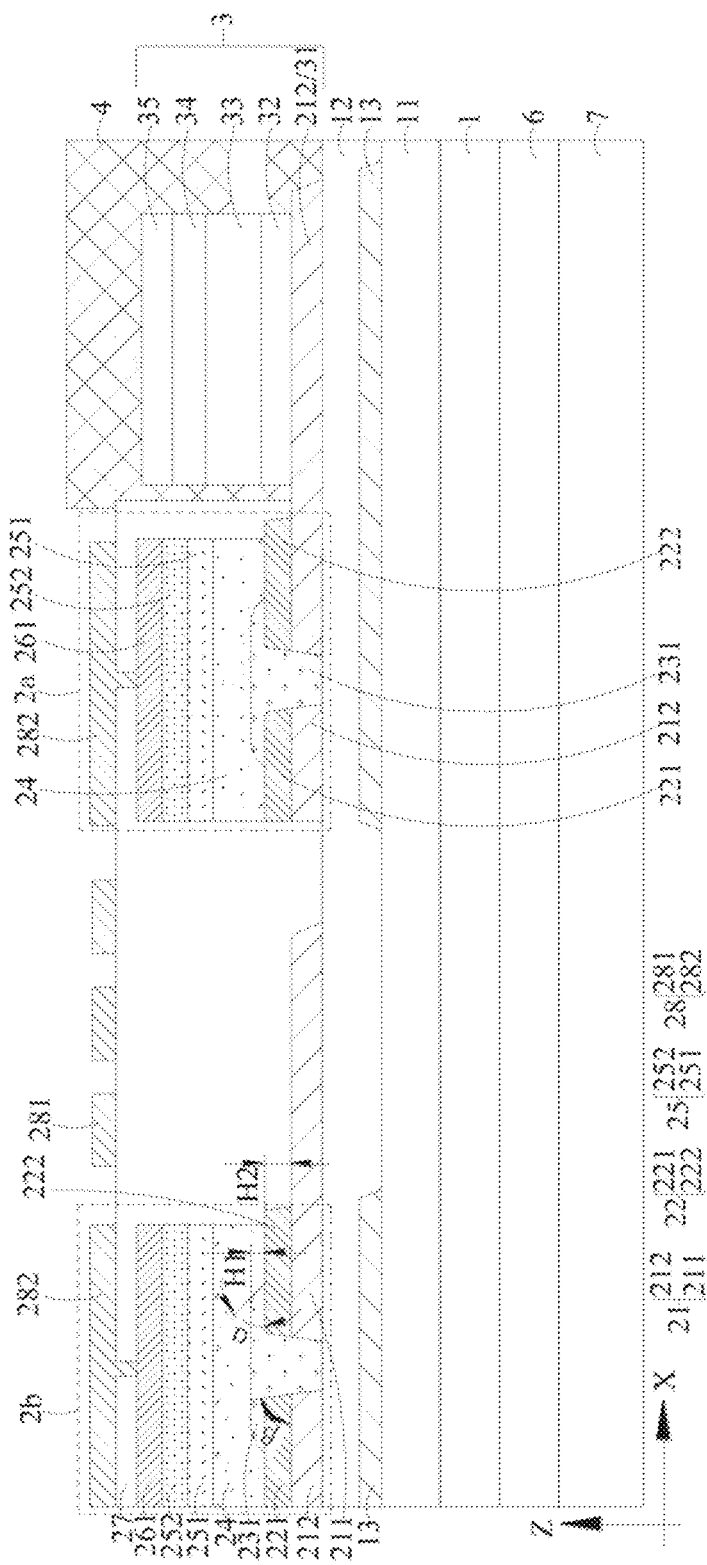
FIG. 3 is a schematic structural diagram of a photodetection backplane according to a third example implementation of the present disclosure.

Furthermore, referring to FIG. 3, in some further example implementations of the present disclosure, the encapsulation layer 4 may only cover the organic photodetector 3 without covering the first organic switching unit 2a and the second organic switching unit 2b.

Figure 4:
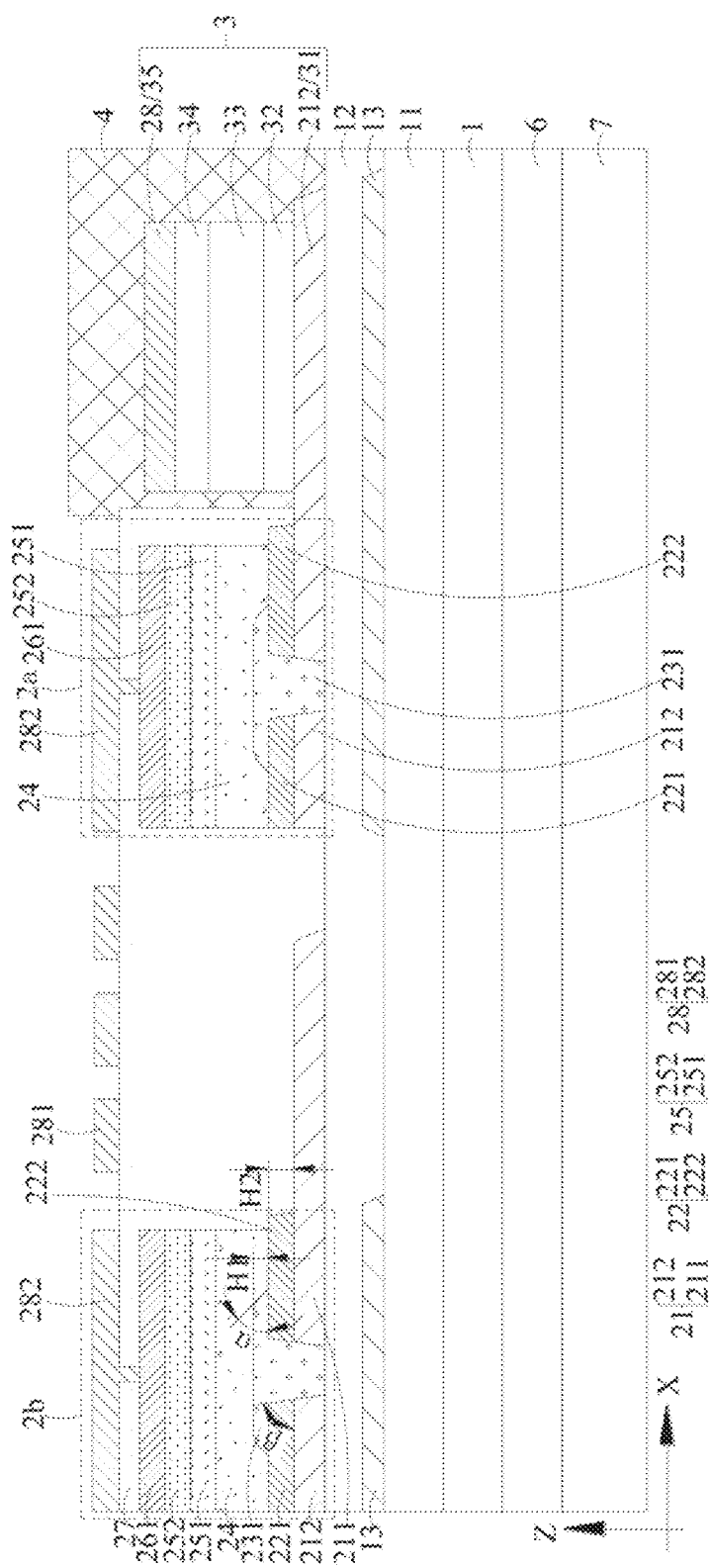
FIG. 4 is a schematic structural diagram of a photodetection backplane according to a fourth example implementation of the present disclosure.

Referring to FIG. 4, when the second electrode layer 28 is provided, the second conductive injection layer 35 and the second electrode layer 28 may be arranged in the same layer and made of the same material, and the second conductive injection layer 35 and the second electrode layer 28 are spaced apart. That is, the second conductive injection layer 35 and the second electrode layer 28 may be formed through the same patterning process.

Figure 5:
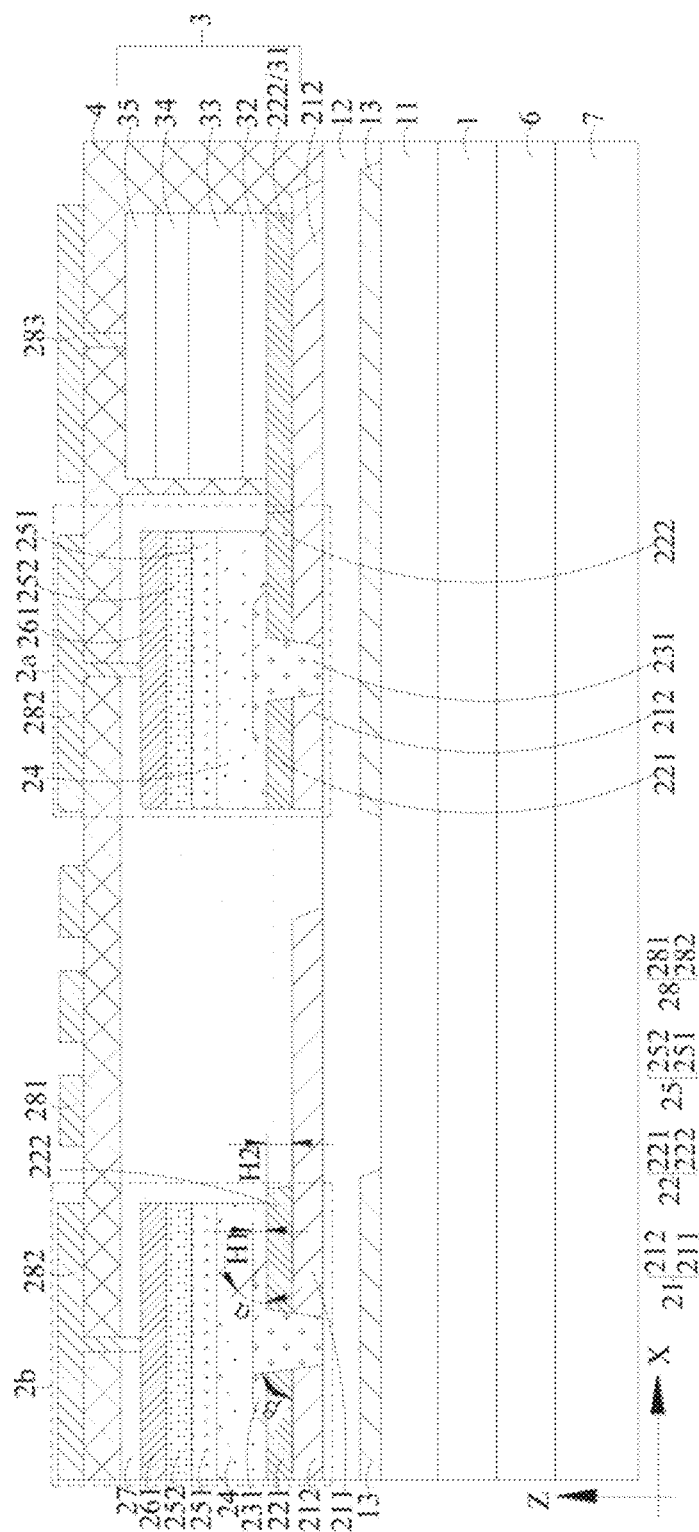
FIG. 5 is a schematic structural diagram of a photodetection backplane according to a fifth example implementation of the present disclosure.

Referring to FIG. 5, the first conductive injection layer 31 and the first conductive layer 22 may be arranged in the same layer and made of the same material, and the first conductive injection layer 31 is connected to the drain electrode 222. That is, the drain electrode 222 is set to be relatively large, a part of the drain electrode 222 serves as the drain electrode 222, and the other part of the drain electrode 222 serves as the first conductive injection layer 31. Moreover, since the first conductive layer 22 and the first electrode layer 21 are formed through the same patterning process and the first electrode layer 21 is located between the first conductive layer 22 and the base substrate 1, the first electrode layer 21 is protected by the first conductive layer 22 during etching. Therefore, the first electrode layer 21 necessarily remain at the side of the first conductive layer 22 close to the base substrate 1.

The first conductive transport layer 32, the photoelectric conversion layer 33, the second conductive transport layer 34 and the second conductive injection layer 35 are sequentially stacked at the side of the first conductive injection layer 31 away from the base substrate 1, so that the organic photodetector 3 is arranged side by side with the first organic switching unit 2a and the second organic switching unit 2b at the same side of the base substrate 1.

The first conductive injection layer 31 may be a hole injection layer, the first conductive transport layer 32 may be a hole transport layer, the second conductive transport layer 34 may be an electron transport layer, and the second conductive injection layer 35 may be an electron injection layer. Alternatively, in some other example implementations of the present disclosure, the first conductive injection layer 31 may be an electron injection layer, the first conductive transport layer 32 may be an electron transport layer, the second conductive transport layer 34 may be a hole transport layer, and the second conductive injection layer 35 may be a hole injection layer.

The encapsulation layer 4 may be arranged at a side of the passivation layer 27 and the organic photodetector 3 away from the base substrate 1, and the second electrode layer 28 is arranged at a side of the encapsulation layer 4 away from the base substrate 1. The second electrode layer 28 may include a second electrode 281, a gate connection portion 282 and a connection line 283. The second electrode 281 may be a common electrode, and the gate connection portion 282 be connected to a gate electrode through a via hole in the passivation layer 27 and a via hole in the encapsulation layer 4 to provide a scan signal to the gate electrode. The connection line 283 may be connected to the second conductive injection layer 35 through a via hole in the encapsulation layer 4.

Figure 6:
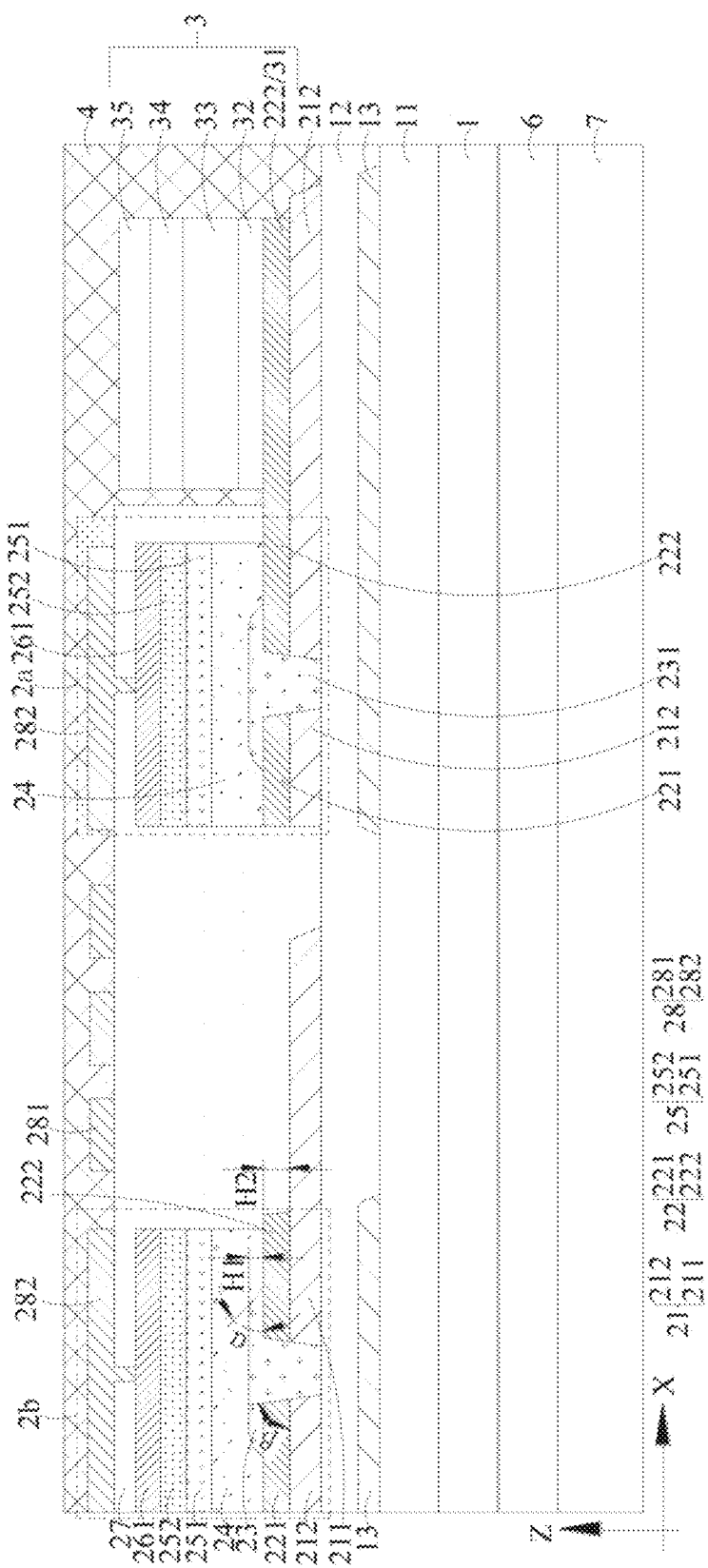
FIG. 6 is a schematic structural diagram of a photodetection backplane according to a sixth example implementation of the present disclosure.

Of course, as shown in FIG. 6, the encapsulation layer 4 may be arranged at a side of the second electrode layer 28 away from the base substrate 1.

In addition, the encapsulation layer 4 may only cover the organic photodetector 3 without covering the first organic switching unit 2*a* and the second organic switching unit 2*b*.

In some other example implementations of the present disclosure, in a case where the second electrode layer 28 is provided, the second conductive injection layer 35 and the second electrode layer 28 may be arranged in the same layer and made of the same material, and the second conductive injection layer 35 and the second electrode layers 28 are spaced apart, that is, the second conductive injection layer 35 and the second electrode layer 28 may be formed through the same patterning process.

Figure 7:
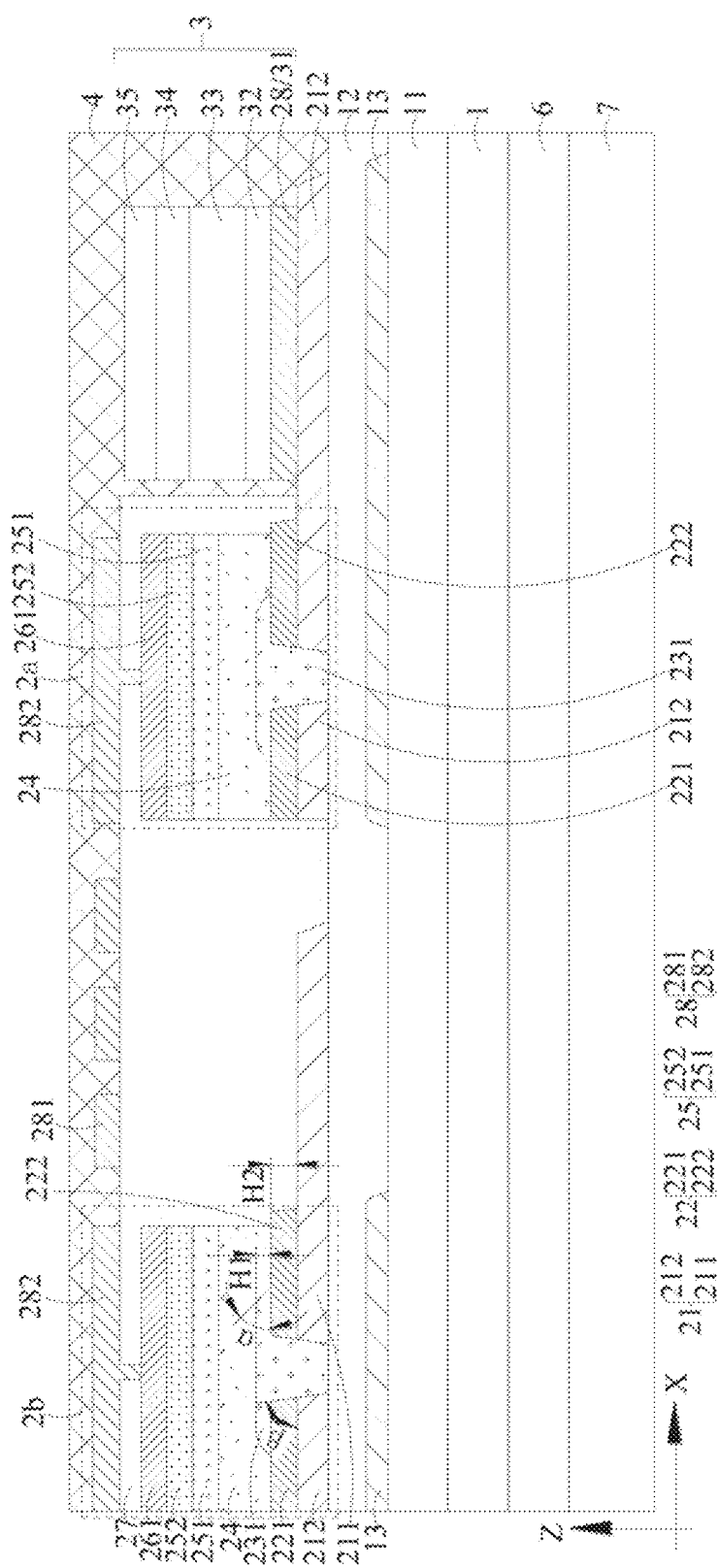
FIG. 7 is a schematic structural diagram of a photodetection backplane according to a seventh example implementation of the present disclosure.

Referring to FIG. 7, the first conductive injection layer 31 and the second electrode layer 28 may be arranged in the same layer and made of the same material. That is, the first conductive injection layer 31 and the second electrode layer 28 may be formed through the same patterning process. The first conductive injection layer 31 is spaced apart from the second electrode layer 28. The first conductive injection layer 31 may be arranged at a side of the first electrode layer 21 away from the base substrate 1. Specifically, the first conductive injection layer 31 may be arranged at a side of the resistance-reducing connection portion 212 connected to the drain electrode 222 away from the base substrate 1, that is, the resistance-reducing connection portion 212 connected to the drain electrode 222 is designed to have a relatively large area, and a part of the resistance-reducing connection portion 21 is used to provide the first conductive injection layer 31. Of course, the first conductive injection layer 31 may also be arranged at a side of the first conductive layer 22 away from the base substrate 1. Specifically, the first conductive injection layer 31 may also be arranged at a side of the drain electrode 222 away from the base substrate 1.

The first conductive transport layer 32, the photoelectric conversion layer 33, the second conductive transport layer 34 and the second conductive injection layer 35 are sequentially stacked at a side of the first conductive injection layer 31 away from the base substrate 1, so that the organic photodetector 3 is arranged side by side with the first organic switching unit 2*a* and the second organic switching unit 2*b* at the same side of the base substrate 1.

The first conductive injection layer 31 may be a hole injection layer, the first conductive transport layer 32 may be a hole transport layer, the second conductive transport layer 34 may be an electron transport layer, and the second conductive injection layer 35 may be an electron injection layer. Alternatively, in some other example implementations of the present disclosure, the first conductive injection layer 31 may be an electron injection layer, the first conductive transport layer 32 may be an electron transport layer, the second conductive transport layer 34 may be a hole transport layer, and the second conductive injection layer 35 may be a hole injection layer.

In this case, the encapsulation layer 4 may be arranged at a side of the organic photodetector 3 and the second electrode layer 28 away from the base substrate 1. That is, the encapsulation layer 4 covers all of the organic photodetector 3, the first organic switching unit 2*a* and the second organic switching units 2*b*. Of course, the encapsulation layer 4 may only cover the organic photodetector 3 without covering the first organic switching unit 2*a* and the second organic switching unit 2*b*.

Figure 8:
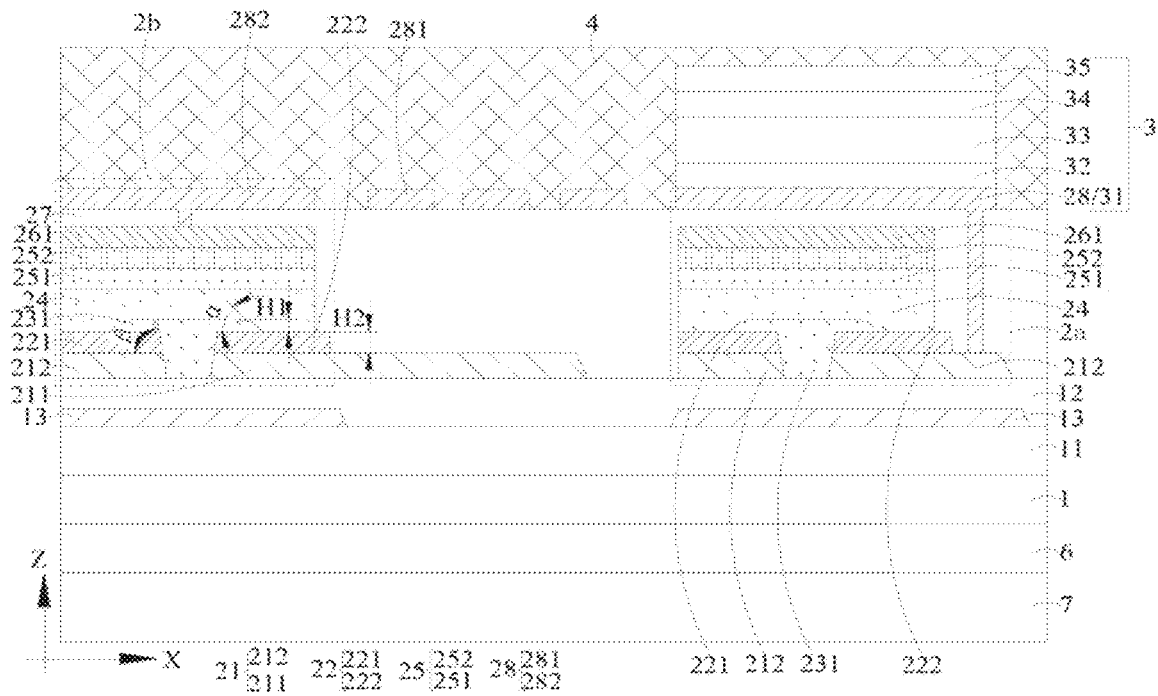
FIG. 8 is a schematic structural diagram of a photodetection backplane according to an eighth example implementation of the present disclosure.

Referring to FIG. 8, a part of the second electrode layer 28 may be reused as the first conductive injection layer 31. Specifically, the second electrode layer 28 may include a second electrode 281, a gate connection portion 282 and a first conductive injection layer 31. The first conductive injection layer 31 is connected to the first electrode layer 21. Specifically, the first conductive injection layer 31 is connected to the resistance-reducing connection portion 212 connected to the drain electrode 222 through a via hole in the passivation layer 27. Of course, the area of the drain electrode 222 may be set to be relatively large, so that the first conductive injection layer 31 is connected to the drain electrode 222 through a via hole in the passivation layer 27. In this case, a resistance-reducing connection portion 212 is also provided at a side of the drain electrode 222 close to the base substrate 1.

The first conductive transport layer 32, the photoelectric conversion layer 33, the second conductive transport layer 34 and the second conductive injection layer 35 are sequentially stacked at a side of the first conductive injection layer 31 away from the base substrate 1, so that the organic photodetector 3 is stacked with the first organic switching unit 2*a*. That is, the organic photodetector 3 is arranged at a side of the first organic switching unit 2*a* away from the base substrate 1. Such an arrangement may reduce the occupied area of the organic photodetector 3 and increase the aperture ratio.

The first conductive injection layer 31 may be a hole injection layer, the first conductive transport layer 32 may be a hole transport layer, the second conductive transport layer 34 may be an electron transport layer, and the second conductive injection layer 35 may be an electron injection layer. Alternatively, in some other example implementations of the present disclosure, the first conductive injection layer 31 may be an electron injection layer, the first conductive transport layer 32 may be an electron transport layer, the second conductive transport layer 34 may be a hole transport layer, and the second conductive injection layer 35 may be a hole injection layer.

In this case, the encapsulation layer 4 may be arranged at a side of the organic photodetector 3 and the second electrode layer 28 away from the base substrate 1. That is, the encapsulation layer 4 covers all of the organic photodetector 3 and the second organic switching unit 2*b*. Alternatively, the encapsulation layer 4 may only cover the organic photodetector 3 without covering the second organic switching unit 2*b*.

Referring to FIG. 11, in this example implementation, a protective layer 29 is arranged between the gate insulating layer group 25 and the gate layer 26. That is, the protective layer 29 is arranged at a side of the gate insulating layer group 25 away from the base substrate 1, and the protective layer 29 also covers the sidewalls of the organic active layer 24 and the first electrode layer 21. The gate layer 26 is arranged at a side of the protective layer 29 away from the base substrate 1, and the passivation layer 27 is arranged at a side of the gate electrode 261 away from the base substrate 1.

The gate electrode and the first conductive injection layer 31 are arranged in the same layer and made of the same material, that is, the gate layer 26 may include the gate electrode and the first conductive injection layer 31. The gate electrode and the first conductive injection layer 31 are formed through the same patterning process; the gate electrode is spaced apart from the first conductive injection layer 31, and there is no connection between the gate electrode and the first conductive injection layer 31. The first conductive injection layer 31 is arranged at a side of the protective layer 29 away from the base substrate 1. The first conductive injection layer 31 is connected to the first electrode layer 21. Specifically, the first conductive injection layer 31 is connected to the resistance-reducing connection portion 212 connected to the drain electrode 222 through a via hole in the protective layer 29. The first conductive transport layer 32, the photoelectric conversion layer 33, the second conductive transport layer 34 and the second conductive injection layer 35 are sequentially stacked at a side of the first conductive injection layer 31 away from the base substrate 1. This arrangement allows the organic photodetector 3 and the first organic switching unit 2a to be stacked in a staggered manner, that is, the organic photodetector 3 is arranged at a side of the first organic switching unit 2a away from the base substrate 1.

Of course, the area of the via hole in the protective layer 29 may be set to relatively large, so that the entire first conductive injection layer 31 is arranged in the via hole and is located at the side of the first electrode 211 away from the base substrate 1. The first conductive injection layer 31 is directly connected to the first electrode 211, and the organic photodetector 3 may also be arranged in the via hole, so that the organic photodetector 3 and the first organic switching unit 2a are arranged side by side.

The area of the drain electrode 222 may also be set to be relatively large, so that the first conductive injection layer 31 is connected to the drain electrode 222 through the via hole in the protective layer 29. In this case, the resistance-reducing connection portion 212 is also arranged at the side of the drain electrode 222 close to the base substrate 1.

In this case, the encapsulation layer 4 may cover the organic photodetector 3 and the first organic switching unit 2a without covering the second organic switching unit 2b. Of course, the encapsulation layer 4 may also be arranged at a side of the organic photodetector 3 and the second electrode layer 28 away from the base substrate 1. That is, the encapsulation layer 4 covers all of the organic photodetector 3 and the second organic switching unit 2b. It is also possible that the encapsulation layer 4 only covers the organic photodetector 3 without covering the first organic switching unit 2a and the second organic switching unit 2b.

In the above example implementations, the first conductive injection layer 31 is connected to the drain electrode 222. The reading principle of an electrical signal on the organic photodetector 3 is as follows. The organic photodetector 3 receives light irradiation and converts the optical signal into an electrical signal. The gate electrode of the first organic switching unit 2a receives a scan signal and turns on the first organic switching unit 2a, so that the electrical signal on the organic photodetector 3 is read through the drain electrode 222 and the source electrode 221. The stronger the light intensity, the stronger the electrical signal converted by the organic photodetector 3, the greater the value of the data signal read through the drain electrode 222 and the source electrode 221. Conversely, the smaller the light intensity, the weaker the electrical signal converted by the organic photodetector 3, and the smaller the value of the data signal read through the drain electrode 222 and the source electrode 221. In this way, the purpose of detecting the light intensity can be achieved.

Figure 9:
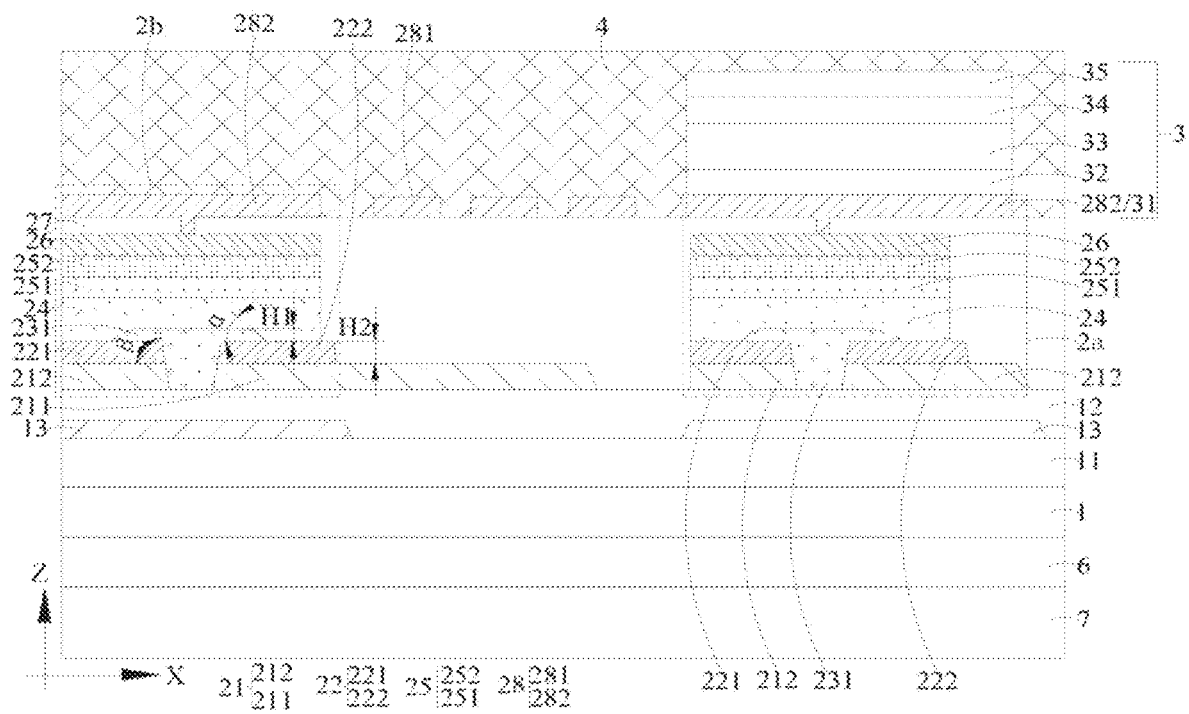
FIG. 9 is a schematic structural diagram of a photodetection backplane according to a ninth example implementation of the present disclosure.

Referring to FIG. 9, in this example implementation, a part of the second electrode layer 28 may be reused as the first conductive injection layer 31. Specifically, the second electrode layer 28 may include a second electrode 281 and a gate connection portion 282. The gate connection portion 282 is reused as the first conductive injection layer 31. The gate connection portion 282 is connected to a gate electrode, that is, the first conductive injection layer 31 is connected to the gate electrode. Specifically, the first conductive injection layer 31 is connected to the gate electrode through a via hole in the passivation layer 27.

The first conductive transport layer 32, the photoelectric conversion layer 33, the second conductive transport layer 34 and the second conductive injection layer 35 are sequentially stacked at the side of the first conductive injection layer 31 away from the base substrate 1, so that the organic photodetector 3 is stacked with the first organic switching unit 2a. That is, the organic photodetector 3 is arranged at the side of the first organic switching unit 2a away from the base substrate 1.

The first conductive injection layer 31 may be a hole injection layer, the first conductive transport layer 32 may be a hole transport layer, the second conductive transport layer 34 may be an electron transport layer, and the second conductive injection layer 35 may be an electron injection layer. Alternatively, in some other example implementations of the present disclosure, the first conductive injection layer 31 may be an electron injection layer, the first conductive transport layer 32 may be an electron transport layer, the second conductive transport layer 34 may be a hole transport layer, and the second conductive injection layer 35 may be a hole injection layer.

Figure 10:
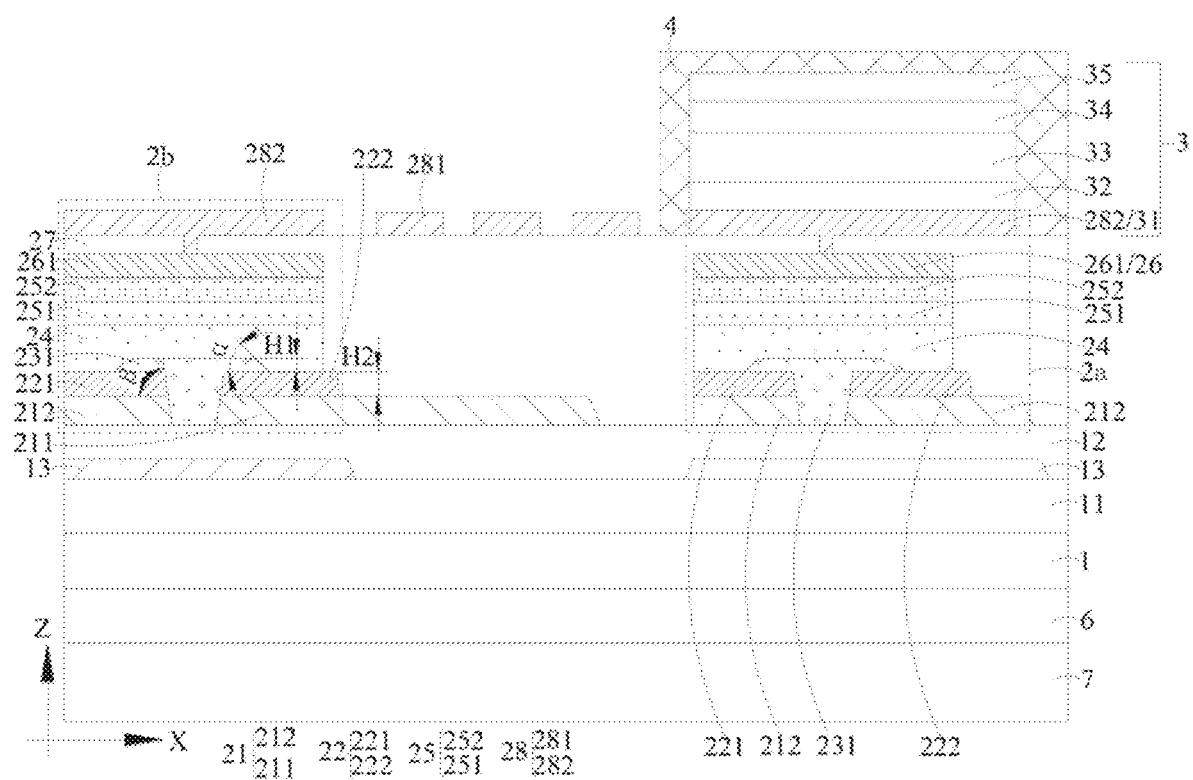
FIG. 10 is a schematic structural diagram of a photodetection backplane according to a tenth example implementation of the present disclosure.

In this case, the encapsulation layer 4 may be arrange at the side of the organic photodetector 3 and the second electrode layer 28 away from the base substrate 1. That is, the encapsulation layer 4 covers all of the organic photodetector 3 and the second organic switching unit 2b. Alternatively, as shown in FIG. 10, the encapsulation layer 4 may only cover the organic photodetector 3 without covering the second organic switching unit 2b.

Referring to FIG. 12, in the example implementation, the gate electrode may be reused as the first conductive injection layer 31. The first conductive transport layer 32, the photoelectric conversion layer 33, the second conductive transport layer 34 and the second conductive injection layer 35 are sequentially stacked at the side of the first conductive injection layer 31 away from the base substrate 1, so that the organic photodetector 3 is stacked with the first organic switching unit 2a. That is, the organic photodetector 3 is arranged at the side of the first organic switching unit 2a away from the base substrate 1.

The first conductive injection layer 31 may be a hole injection layer, the first conductive transport layer 32 may be a hole transport layer, the second conductive transport layer 34 may be an electron transport layer, and the second conductive injection layer 35 may be an electron injection layer. Alternatively, in some other example implementations of the present disclosure, the first conductive injection layer 31 may be an electron injection layer, the first conductive transport layer 32 may be an electron transport layer, the second conductive transport layer 34 may be a hole transport layer, and the second conductive injection layer 35 may be a hole injection layer.

In this case, the encapsulation layer 4 may be arranged at the side of the organic photodetector 3 and the second electrode layer 28 away from the base substrate 1, that is, the encapsulation layer 4 covers all of the organic photodetector 3 and the second organic switching unit 2b. Alternatively, the encapsulation layer 4 may only cover the organic photodetector 3 without covering the second organic switching unit 2b.

In the above example implementations, the first conductive injection layer 31 is connected to the gate electrode. The reading principle of an electrical signal on the organic photodetector 3 is as follows. The organic photodetector 3 receives light irradiation and converts the optical signal into an electrical signal. The electrical signal is transmitted to the gate electrode of the first organic switching unit 2a through the first conductive injection layer 31. The gate electrode turns on the first organic switching unit 2a, so that the data signal of the source electrode 221 is read out through the drain electrode 222. The larger the light intensity, the stronger the electrical signal converted by the organic photodetector 3, the larger the conductive channel formed by the organic active layer 24 of the first organic switching unit 2a, and the larger the value of the data signal read through the drain electrode 222. Conversely, the smaller the light intensity, the weaker the electrical signal converted by the organic photodetector 3, the smaller the conductive channel formed by the organic active layer 24 of the first organic switching unit 2a, and the smaller the value of the data signal read through the drain electrode 222. In this way, the purpose of detecting light intensity can be achieved.

Referring to FIGS. 1 to 16, a light-filtering layer 5 may be arranged on the photodetection backplane, that is, the photodetection backplane may be used as a color filter substrate.

Referring to FIG. 14, the light-filtering layer 5 may be arranged between the base substrate 1 and the first organic switching unit 2a as well as the organic photodetector 3. Specifically, the light-filtering layer 5 is arranged at a side of the base substrate 15. The first planarization layer 11 is arranged at a side of the light-filtering layer 5 away from the base substrate 1. The first organic switching unit 2a and the organic photodetector 3 are arranged at a side of the first planarization layer 11 away from the base substrate 1. In order to reduce the thickness of the photodetection backplane, the first organic switching unit 2a and the organic photodetector 3 may be arranged side by side at a side of the base substrate 1; the encapsulation layer 4 covers all of the first organic switching unit 2a and the organic photodetector 3 to ensure the flatness of the photodetection backplane. Alternatively, the first organic switching unit 2a and the organic photodetector 3 may be stacked.

The light-filtering layer 5 may include a light-shielding portion 51 and a light-filtering portion 52. The light-filtering portion 52 may include a red filtering portion, a green filtering portion, a blue filtering portion, and so on.

There is no overlapping between the orthographic projection of the light-filtering layer 5 on the base substrate 1 and the orthographic projections of the first organic switching unit 2a and the organic photodetector 3 on the base substrate 1. Since the light is incident from the base substrate 1 side, this arrangement prevents the light-filtering layer 5 from blocking the light incident to the organic photodetector 3 which may affect the detection of light intensity by the photodetector.

Referring to FIG. 15, the light-filtering layer 5 may be arranged at a side of the first organic switching unit 2a and the organic photodetector 3 away from the base substrate 1. Specifically, the first planarization layer 11 is arranged at a side of the base substrate 1, and the first organic switching unit 2a and the organic photodetector 3 are arranged at a side of the first planarization layer 11 away from the base substrate 1. In order to reduce the thickness of the photodetection backplane, the first organic switching unit 2a and the organic photodetector 3 may be arranged side by side at a side of the base substrate 1; the encapsulation layer 4 covers all of the first organic switching unit 2a and the organic photodetector 3 to ensure the flatness of the photodetection backplane and provide a relatively flat base surface for the light-filtering layer 5. The light-filtering layer 5 is arranged at the side of the encapsulation layer 4 away from the base substrate 1. Alternatively, the first organic switching unit 2a and the organic photodetector 3 may be stacked.

The light-filtering layer 5 may include a light-shielding portion 51 and a light-filtering portion 52. The filtering portion 52 may include a red filtering portion, a green filtering portion, a blue filtering portion, and so on.

Since the light is incident from the base substrate 1 side, with such arrangement, the light-filtering layer 5 will not block the light incident to the organic photodetector 3 and will not affect the detection of light intensity by the photodetector.

The specific structures of the first organic switching unit 2a and the organic photodetector 3 have been described in detail above, and therefore will not be described again here. Furthermore, the above-described example implementations of the first organic switching unit 2a and the organic photodetector 3 are applicable here.

Based on the same inventive concept, example implementations of the present disclosure provide a liquid crystal display panel. The liquid crystal display panel may include a photodetection backplane. The photodetection backplane is a photodetection backplane according to any one of the implementations described above. The specific structure of the photodetection backplane has been described in detail above, and thus repeated descriptions will be omitted here.

In a case where the second organic switching unit 2b is arranged on the photodetection backplane, that is, when the photodetection backplane may be used as an array substrate, the liquid crystal display panel may further include a color filter substrate and a liquid crystal layer. The color filter substrate and the photodetection backplane are arranged oppositely. The liquid crystal layer is arranged between the photodetection backplane and the color filter substrate. The liquid crystal display panel may be a flexible liquid crystal display panel. That is, the photodetection backplane may be a flexible photodetection backplane. The color filter substrate may be a flexible color filter substrate. The color filter substrate may include a flexible substrate. The light-shielding portion 51 and the light-filtering portion 52 are arranged at a side of the flexible substrate. The light filtering portion 52 may include a red filtering portion, a green filtering portion, a blue filtering portion, etc.

In a case where the photodetection backplane is provided with the light-filtering layer 5, that is, when the photodetection backplane may be used as a color filter substrate, the liquid crystal display panel may further include an array substrate and a liquid crystal layer, and the array substrate and the photodetection backplane are arranged oppositely. The liquid crystal layer is arranged between the photodetection backplane and the array substrate. The liquid crystal display panel may be a flexible liquid crystal display panel, that is, the photodetection backplane may be a flexible photodetection backplane, and the array substrate may be a flexible array substrate.

Based on the same inventive concept, example implementations of the present disclosure provide a display device. The display device may be a slidable and rollable display device, a foldable display device or a curved display device. The display device may include the liquid crystal display panel according to any one of the above implementations.

The specific structure of the liquid crystal display panel has been described in detail above, and thus repeated descriptions are omitted here.

The specific type of the display device is not particularly limited. Any type of display device commonly known in the field may be used, such as a mobile device like a mobile phone, a wearable device like a watch, a VR device, etc. Those skilled in the art may make proper selection according to the specific use of the display device, and details are omitted here.

It should be noted that, in addition to the liquid crystal display panel, the display device also includes other necessary members and constituting elements, such as a casing, a circuit board, a power cord, etc. Those skilled in the art may consider additional structures of the display device according to the specific usage requirements of the display device, and details are omitted here.

Other embodiments of the present disclosure will be readily apparent to those skilled in the art from consideration of the specification and practice of the invention disclosed herein. The present disclosure is intended to cover any variations, uses, or adaptations of the present disclosure that follow the general principles of the present disclosure and include common knowledge or customary technical means in the technical field that are not disclosed herein. It is intended that the specification and examples be considered as exemplary only, with a true scope and spirit of the present disclosure being indicated by the appended claims.

What is claimed is:

1. A photodetection backplane, comprising:
    a base substrate;
    a first organic switching unit arranged at a side of the base substrate; and
    an organic photodetector arranged at a same side of the base substrate as the first organic switching unit, wherein the organic photodetector is electrically connected to the first organic switching unit, and at least one film layer of the organic photodetector and a film layer of the first organic switching unit are arranged in a same layer and made of a same material.

2. The photodetection backplane according to claim 1, wherein the first organic switching unit comprises:
    a first conductive layer arranged at a side of the base substrate, wherein the first conductive layer comprises a source electrode and a drain electrode;
    an organic planarization layer arranged at a side of the first conductive layer away from the base substrate;
    an organic active layer arranged at a side of the organic planarization layer away from the base substrate, wherein the organic active layer is connected to the source electrode and the drain electrode;
    a gate insulating layer group arranged at a side of the organic active layer away from the base substrate; and
    a gate layer arranged at a side of the gate insulating layer group away from the base substrate, wherein the gate layer comprises a gate electrode.

3. The photodetection backplane according to claim 2, wherein the organic photodetector comprises:
    a first conductive injection layer arranged at the same side of the base substrate as the first organic switching unit;
    a first conductive transport layer arranged at a side of the first conductive injection layer away from the base substrate;
    a photoelectric conversion layer arranged at a side of the first conductive transport layer away from the base substrate;
    a second conductive transport layer arranged at a side of the photoelectric conversion layer away from the base substrate; and
    a second conductive injection layer arranged at a side of the second conductive transport layer away from the base substrate.

4. The photodetection backplane according to claim 3, wherein the first conductive injection layer and the first conductive layer are arranged in a same layer and made of a same material, and the first conductive injection layer is connected to the drain electrode; or
    wherein the gate electrode is reused as the first conductive injection layer; or
    wherein the gate electrode and the first conductive injection layer are arranged in a same layer and made of a same material, and the gate electrode and the first conductive injection layer are spaced apart, and the first conductive injection layer is connected to the drain electrode.

5. The photodetection backplane according to claim 3, wherein the first organic switching unit further comprises:
    a first electrode layer arranged between the base substrate and the first conductive layer, wherein the first electrode layer is electrically connected to the first conductive layer; or
    wherein the first conductive injection layer and the first electrode layer are arranged in a same layer and made of a same material, and the first conductive injection layer is connected with the first electrode layer; or
    wherein the first organic switching unit further comprises:
    a passivation layer arranged at a side of the gate layer away from the base substrate.

6. The photodetection backplane according to claim 5, wherein the first organic switching unit further comprises:
    a second electrode layer arranged at a side of the passivation layer away from the base substrate.

7. The photodetection backplane according to claim 6, wherein the first conductive injection layer and the second electrode layer are arranged in a same layer and made of a same material, the first conductive injection layer and the second conductive layer are spaced apart, and the first conductive injection layer is arranged at a side of the first electrode layer away from the base substrate; or
    wherein a part of the second electrode layer is reused as the first conductive injection layer, and the first conductive injection layer is connected to the first electrode layer or the gate electrode; or
    wherein the first conductive injection layer and the first electrode layer are arranged in a same layer and made of a same material, the first conductive injection layer is connected with the first electrode layer, the second conductive injection layer and the second electrode layer are arranged in a same layer and made of a same material, and the second conductive injection layer and the second electrode layer are spaced apart; or
    wherein the first conductive injection layer and the first conductive layer are arranged in a same layer and made of a same material, the first conductive injection layer is connected to the drain electrode, the second conductive injection layer and the second electrode layer are arranged in a same layer and made of a same material, and the second conductive injection layer and the second electrode layer are spaced apart.

8. The photodetection backplane according to claim 5, wherein the first organic switching unit further comprises:
    a protective layer arranged between the gate insulating layer group and the gate layer and covering a sidewall of the organic active layer, wherein the passivation layer is arranged at a side of the protective layer away from the base substrate.

9. The photodetection backplane according to claim 5, further comprising:
an encapsulation layer covering the organic photodetector and arranged at a side of the passivation layer away from the base substrate, wherein the second electrode is arranged at a side of the encapsulation layer away from the base substrate.

10. The photodetection backplane according to claim 1, further comprising:
an encapsulation layer covering at least the organic photodetector.

11. The photodetection backplane according to claim 10, wherein the encapsulation layer covers the organic photodetector and the first organic switching unit.

12. The photodetection backplane according to claim 1, wherein:
the first conductive injection layer is a hole injection layer, the first conductive transport layer is a hole transport layer, the second conductive transport layer is an electron transport layer, and the second conductive injection layer is an electron injection layer; or
the first conductive injection layer is an electron injection layer, the first conductive transport layer is an electron transport layer, the second conductive transport layer is a hole transport layer, and the second conductive injection layer is a hole injection layer.

13. The photodetection backplane according to claim 1, further comprising:
a second organic switching unit, wherein film layers of the second organic switching unit and corresponding film layers of the first organic switching unit are arranged in same layers and are made of same materials, respectively, and the second organic switching unit is used for controlling a display unit.

14. The photodetection backplane according to claim 1, further comprising:
a light-filtering layer arranged between the base substrate and the first organic switching unit as well as the organic photodetector, wherein there is no overlap between an orthographic projection of the light-filtering layer on the base substrate and orthographic projections of the first organic switching unit and the organic photodetector on the base substrate.

15. The photodetection backplane according to claim 1, further comprising:
a light-filtering layer arranged at a side of the first organic switching unit and the organic photodetector away from the base substrate.

16. The photodetection backplane according to claim 2, wherein:
a first via hole is arranged in the organic planarization layer, and the organic active layer is connected to the source electrode through the first via hole, and is connected to the drain electrode through the first via hole; or,
a first gap is provided between the source electrode and the drain electrode, the organic planarization layer comprises a plurality of organic planarization portions spaced apart, one of the organic planarization portions is at least arranged in the first gap, and the organic planarization portion does not cover at least end portions of the source electrode and the drain electrode away from the first gap.

17. The photodetection backplane according to claim 16, wherein:
an angle between a hole wall of the first via hole and a surface of the first conductive layer away from the base substrate is smaller than an angle between a sidewall of the first conductive layer and a surface of the first electrode layer close to the first conductive layer; or
an angle between a sidewall of the organic planarization portion close to the first gap and a surface of the first conductive layer close to the organic planarization layer is smaller than an angle between a sidewall of the first conductive layer close to the first gap and the surface of the first electrode layer close to the first conductive layer.

18. The photodetection backplane according to claim 17, wherein:
the angle between the hole wall of the first via hole and the surface of the first conductive layer away from the base substrate is smaller than or equal to 70°; or
the angle between the sidewall of the organic planarization portion close to the first gap and the surface of the first conductive layer close to the organic planarization layer is smaller than or equal to 70°.

19. A liquid crystal display panel, comprising: a photodetection backplane;
wherein the photodetection backplane comprises:
a base substrate;
a first organic switching unit arranged at a side of the base substrate; and
an organic photodetector arranged at a same side of the base substrate as the first organic switching unit, wherein the organic photodetector is electrically connected to the first organic switching unit, and at least one film layer of the organic photodetector and a film layer of the first organic switching unit are arranged in a same layer and made of a same material.

20. A liquid crystal display device, comprising: a liquid crystal display panel,
wherein the liquid crystal display device is a slidable and rollable display device, a foldable display device or a curved surface display device;
wherein the liquid crystal display panel comprises a photodetection backplane which comprises:
a base substrate;
a first organic switching unit arranged at a side of the base substrate; and
an organic photodetector arranged at a same side of the base substrate as the first organic switching unit, wherein the organic photodetector is electrically connected to the first organic switching unit, and at least one film layer of the organic photodetector and a film layer of the first organic switching unit are arranged in a same layer and made of a same material.

* * * * *